United States Patent [19]

Das

[11] 4,255,792
[45] Mar. 10, 1981

[54] AUTOMATED ANALOG CIRCUIT TEST SYSTEM

[76] Inventor: Pawan K. Das, 74-153 Country Club Rd., Fatontown, N.J. 07724

[21] Appl. No.: 953,278

[22] Filed: Oct. 13, 1978

[51] Int. Cl.³ .................. G06F 11/00; G01R 31/02
[52] U.S. Cl. ............................ 364/580; 364/481; 324/73 AT
[58] Field of Search ................ 364/580, 488–490; 324/73 R, 73 AT, 73 PC; 235/302, 302.1

[56] References Cited

U.S. PATENT DOCUMENTS

| | | | |
|---|---|---|---|
| 2,776,405 | 1/1957 | Moore et al. | 364/489 X |
| 3,643,156 | 2/1972 | Stewart et al. | 364/488 X |
| 3,705,349 | 12/1972 | Arnold | 324/73 R |
| 3,777,129 | 12/1973 | Mehia | 364/489 |
| 3,810,012 | 5/1974 | Harris | 324/73 R |
| 3,833,853 | 9/1974 | Milford | 324/73 R |
| 4,002,972 | 1/1977 | Konrad et al. | 324/73 R |
| 4,044,244 | 8/1977 | Foreman et al. | 235/302 |
| 4,055,801 | 10/1977 | Pike et al. | 324/73 AT X |
| 4,070,565 | 1/1978 | Borrelli | 324/73 R X |

Primary Examiner—Edward J. Wise

Attorney, Agent, or Firm—Lerner, David, Littenberg & Samuel

[57] ABSTRACT

An automated sequential test system, designed to compare analog test signals, derived from plurality of test nodes, located on the circuit under test with the corresponding reference signals, derived from plurality of similar nodes, located on a pre-tested good reference circuit, is described. The test system generates 'pass signals' for such test nodes, the signal levels compared to lie between the pre-assigned positive and negative tolerance limits of the signal levels on the corresponding reference nodes. Otherwise, the system exhibits a fail signal, digital display count of the node number and polarity of failure from the reference signal in its tolerance band for such nodes which do not pass the test limit. These test capabilities incorporate static and dynamic signal testing and signal frequency comparison, capability to connect a node with an external source, sink or instrument, option to program any tolerance limit on a reference signal, option to monitor all test and reference signals on the same monitor terminal, power-on reset, automatic reset at the end of the system test cycle and capability to hold and skip a typical node for test purposes.

22 Claims, 28 Drawing Figures $$TOL = -a \leq \frac{V_U - V_R}{V_R} \leq a$$

$$TOL = -\beta \leq \frac{V_U - V_R}{V_R} \leq \alpha$$

AUTOMATED ANALOG CIRCUIT TEST SYSTEM

BACKGROUND OF THE INVENTION

Several inventions have been disclosed to date which employ formulated mathematical relationships to compare, test and measure signals on digital circuits with regard to binary signal changes. Some methods test the continuity of a source or signal bus as well as its short circuit occurence with a neighbouring signal bus or node have been observed. No method to date has been proposed which could compare and test static and dynamic signal levels on a test circuit, particularly when the potential level and frequency of such signals are different at different test nodes and the magnitude of signal levels are affected by the influence of environmental conditions. With the advent of sophisticated printed circuit board manufacturing, involving digital, as well as linear discrete and integrated components, the electronic manufacturing industry has been searching for an automated system that could perform desirable tests on linear circuits under the bounds of a pre-assigned tolerance level. This invention describes such methods of testing and opens a new era in the analog circuit test and troubleshooting.

SUMMARY OF THE INVENTION

There is described herein with reference to the accompanying drawings a sequential test system concept suitable for testing a linear electronic circuit by comparing signal levels on plurality of nodes with the corresponding reference signal levels derived from similar nodes of a similar but good reference circuit. The invention comprises the following three types of test systems, all aimed at meeting the same objective—

(i) A sequential test system which comprises two test channels, one to collect and process multiplexed signals from the circuit under test and the other to perform the same operation on signals derived from the reference circuit, and finally to compare the signals and provide the result.

(ii) A sequential test system which multiplexes the entire test and reference circuits in the beginning during each test point multiplexing interval, collects and processes both signals during two sub-intervals through a common test channel, compares and provides the test result from stored signals during the third sub-interval and finally resets the associated circuits during the fourth sub-interval in order to make the system ready to accept a new signal from the next test point.

(iii) A sequential test system which collects and processes multiplexed signals from the circuit under test, compares such signals from simulated reference signals derived from test data stored in a mini-computer or microprocessor controlled system, provides the test result and provides information on a commonly available computer output channel, such as paper print out, magnetic tape, floppy disc, display terminal, or ASCII codes for remote transmission.

While the invention covers all three systems stated above, maximum emphasis is given in the description of the system stated in item (ii) above.

The heart of the test system is the signal comparator, which has been derived from a basic mathematical model of comparing a test signal with a reference signal within a pre-assigned tolerance limit. THe basic relationship has been re-arranged to yield five different circuits of signal comparators and a sixth such circuit has actually been used in the system.

The system incorporates constant current adjustable power supply, as opposed to constant voltage power source for activating the unit under test and the reference circuit. Such activation may be accomplished by a constant voltage power supply as well, but the constant current power supply offers some advantage which shall be discussed later. In addition, a constant voltage power supply is used to energize all the circuits associated with the test system.

While the basic system is capable of multiplexing up to 16 test points, provision is made to expand the system capability in increments of 16 test points to include up to 256 test points. The system, as it stands, is capable of testing DC signals of 0.1 VDC to 60 VDC or slightly higher voltage. An attenuator drops the signal to 6 VDC or a lower value and a signal scalar scales down the entire attenuated signal range to between 0.8 VDC and a little under 9 VDC for improved performance.

While a DC signal is passed directly after filtering out AC components, the AC signal is at first decoupled from the DC bias, rectified and then filtered for further processing. A frequency to voltage converter is used to convert the A.C. signal frequency to a DC voltage, which when compared, shall determine the change in frequency from the frequency of the reference circuit.

Tolerance on reference signal variation is applied to each test point by means of a matrix switch, which comprises of nine rows of tolerance values and N columns of lever switches, each lever switch standing for a test node. Additional rows of tolerance values may be added if required.

A logic control block provides the control signals, reset signals, system clock frequencies and has means for providing audible tones and visible displays to correspond with a pass or fail signal. A digital display scans all the test points which pass the test, but stays ON when a test point fails, giving its identification to the user.

BRIEF DESCRIPTION OF DRAWINGS

The invention will become more readily apparent by studying the accompanying drawings, a brief description of which is given below.

Figure 5A:
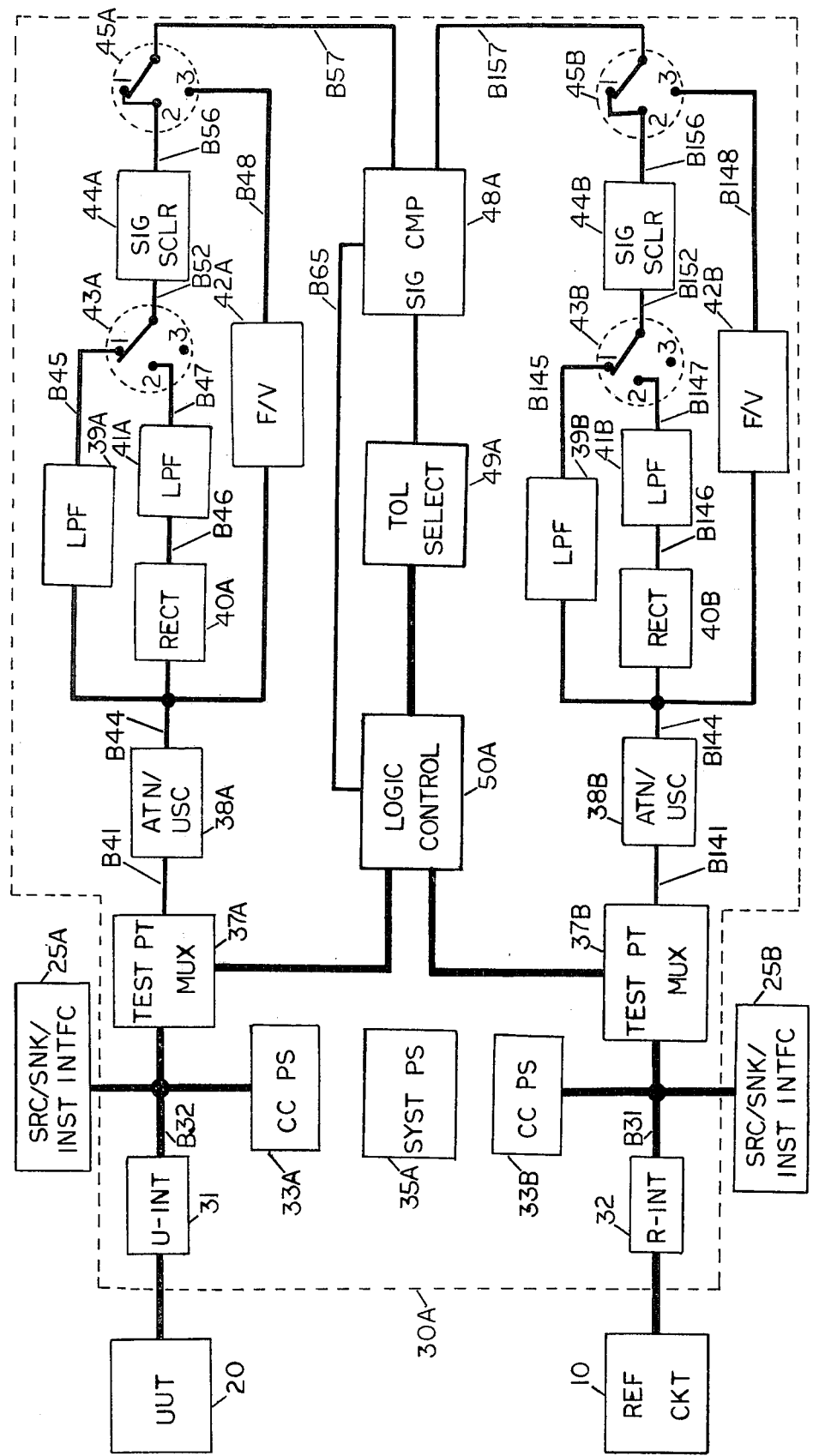
FIGS. 5A, 5B & 5C are the complete test system block diagrams for two channel, single channel and computer/microprocessor controlled systems respectively.
Figure 5B:
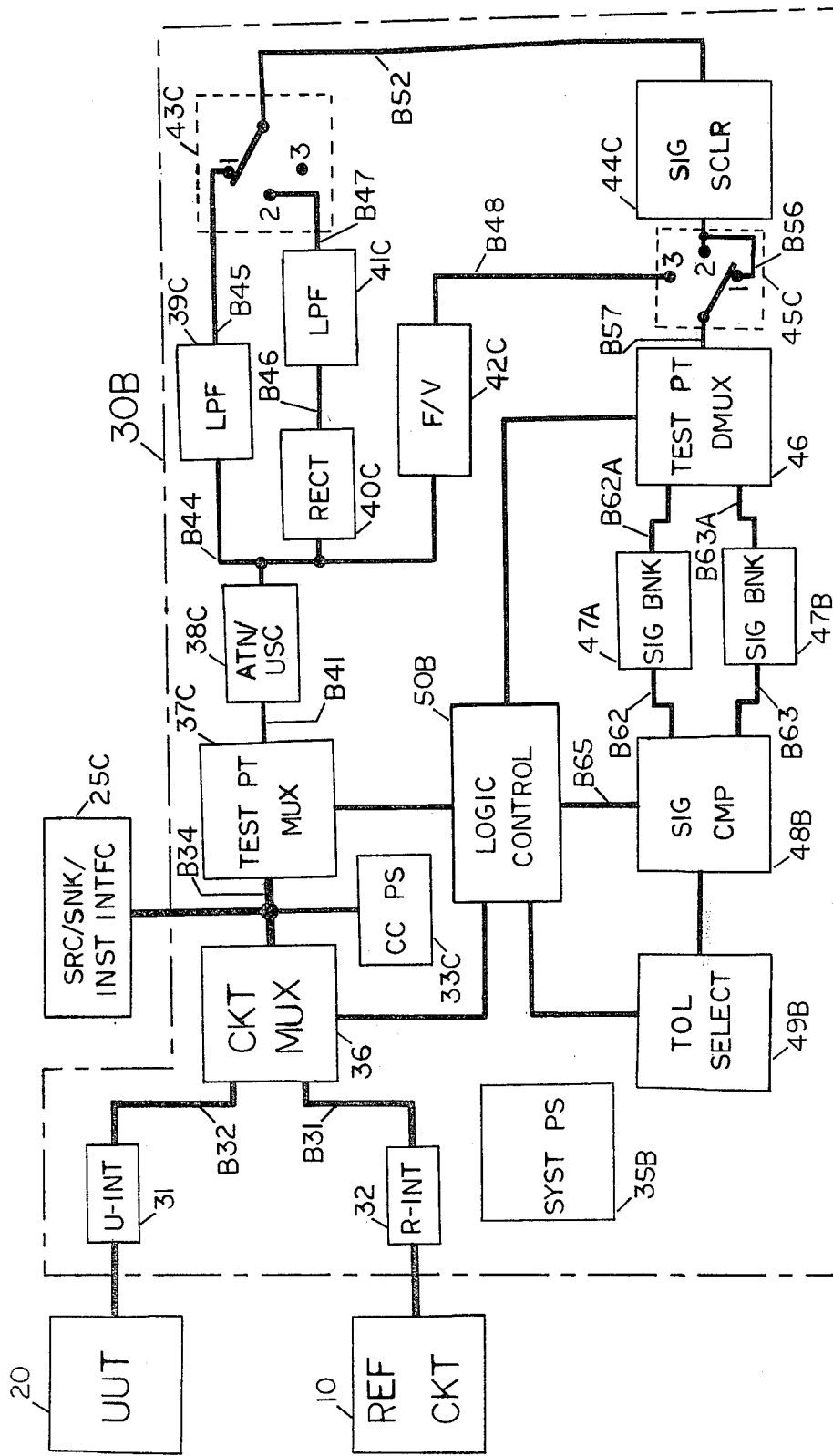
Figure 5C:
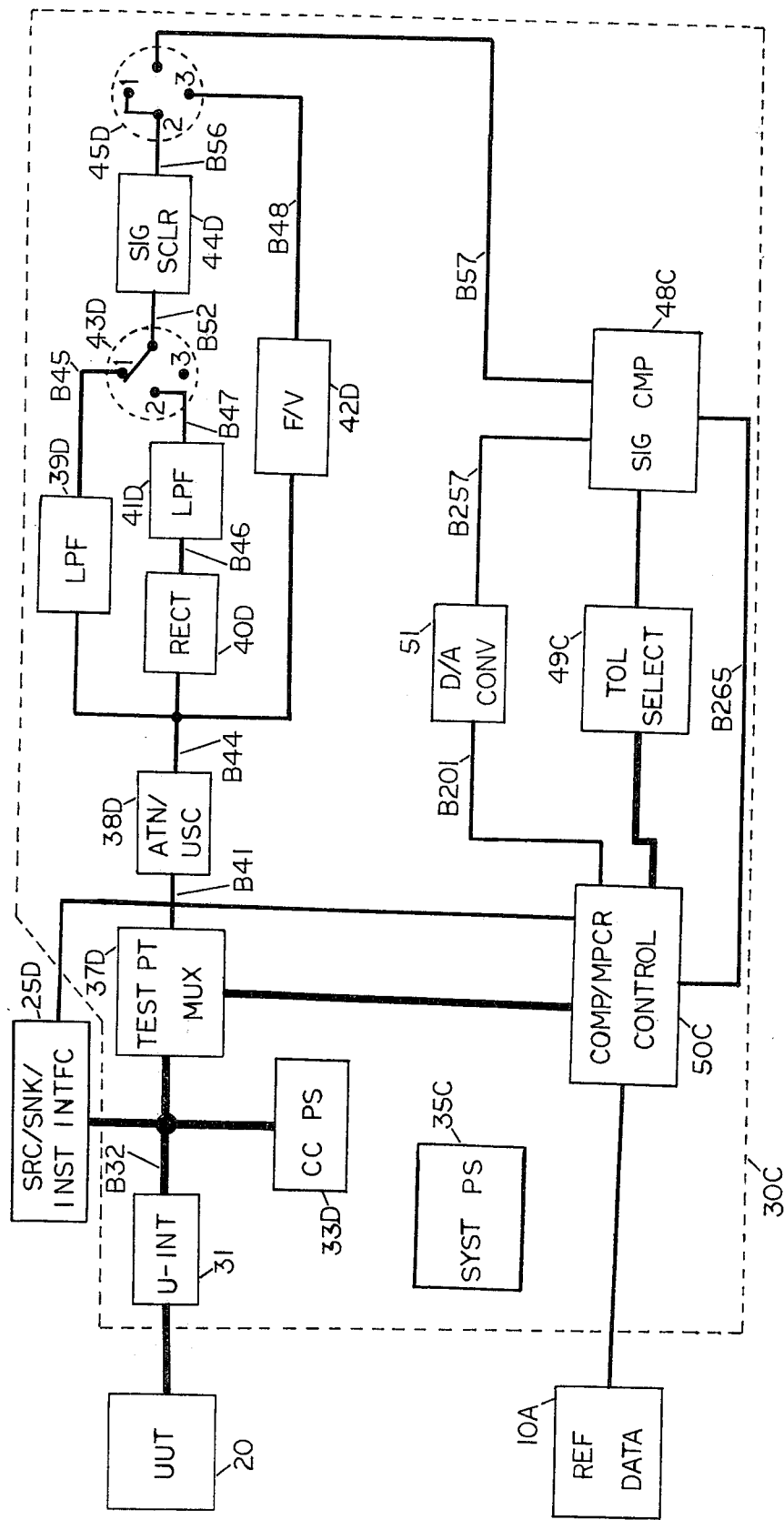

This is for FIG. 5B only and is not required for FIGS. 5A and 5C.

Figure 7:
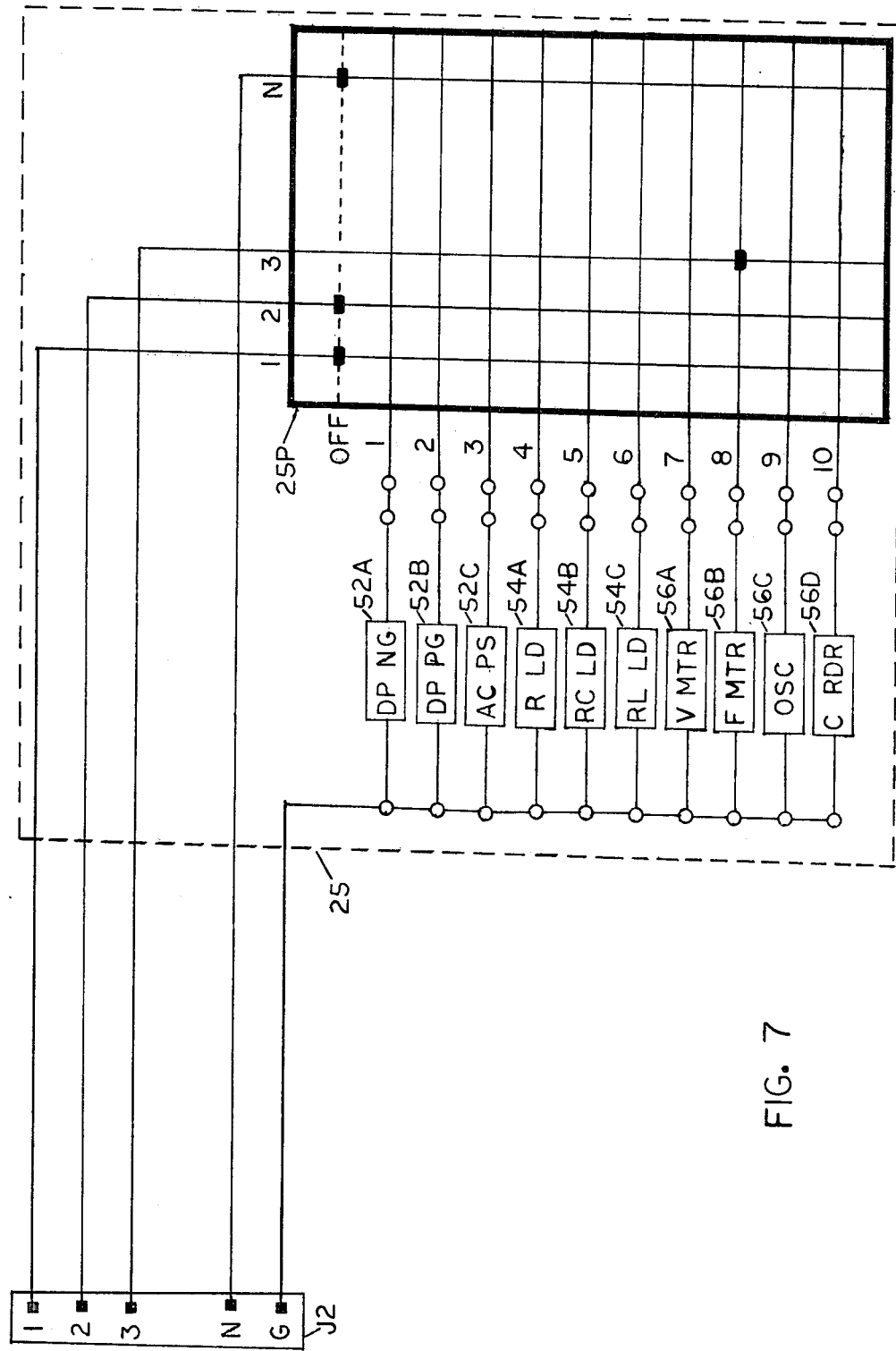

FIG. 7 shows a method of interconnecting external source, sink or instruments with the test point bus. This is for FIGS. 5A and 5B, and requires some modification for FIG. 5C.

Figure 8:
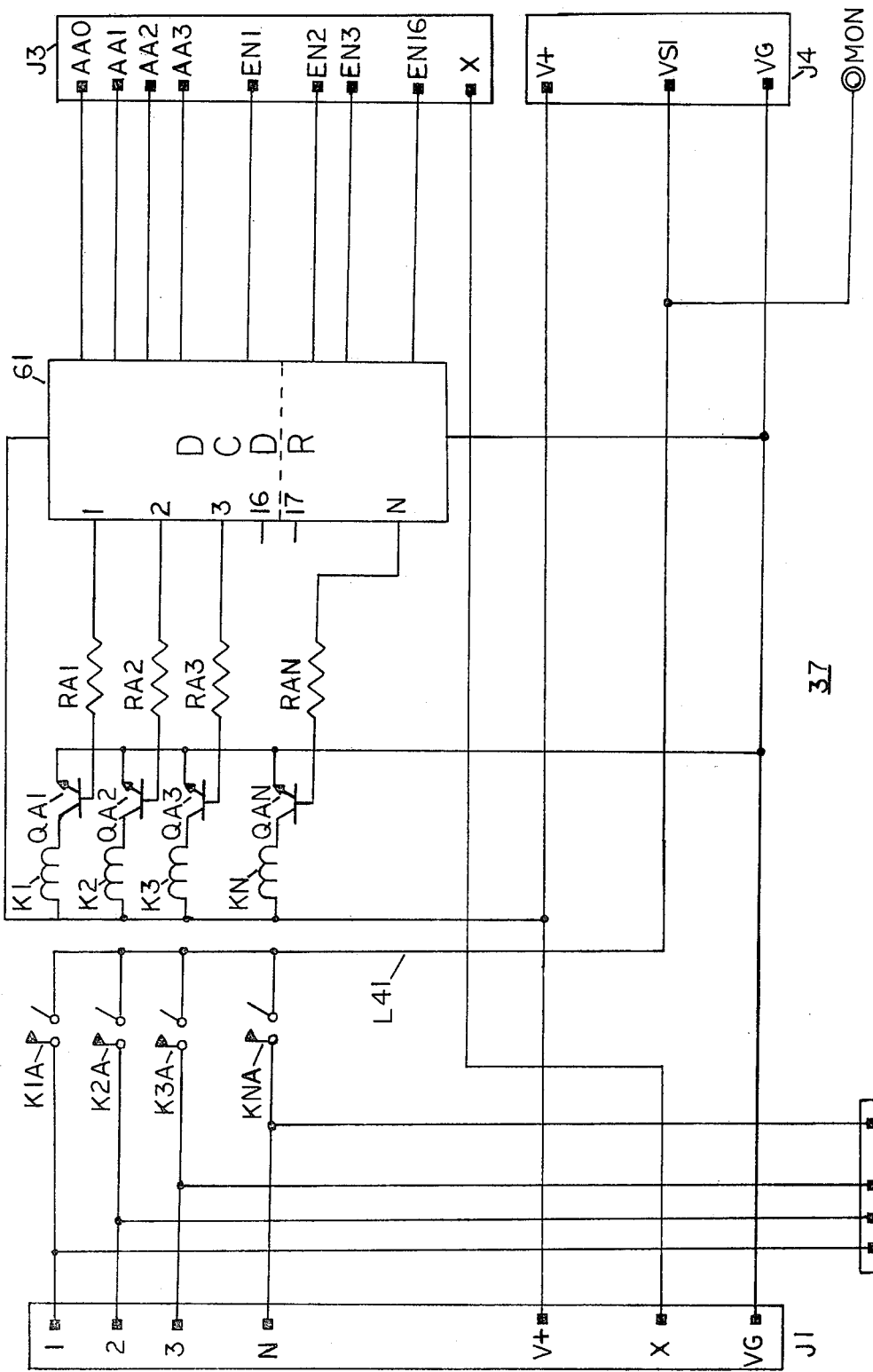

FIG. 8 gives a schematic showing multiplexing different test points with a common signal output line. This is for FIGS. 5A, 5B and 5C.

Figure 9:
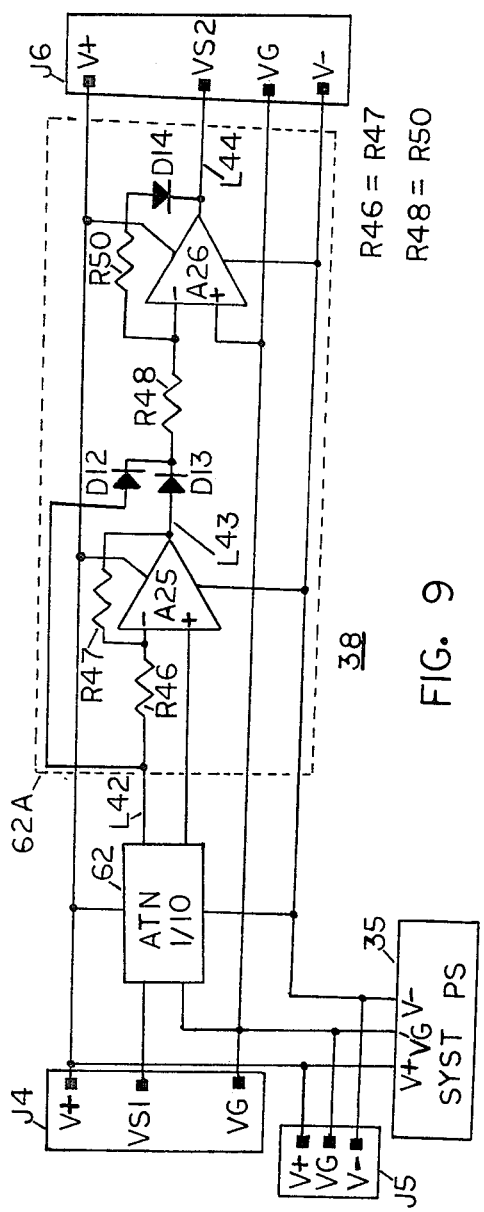

FIG. 9 is a schematic of an attenuator and unipolar signal conditioner. This also shows the connection of the system power supply with the entire system. This is for FIGS. 5A, 5B & 5C.

Figure 10:
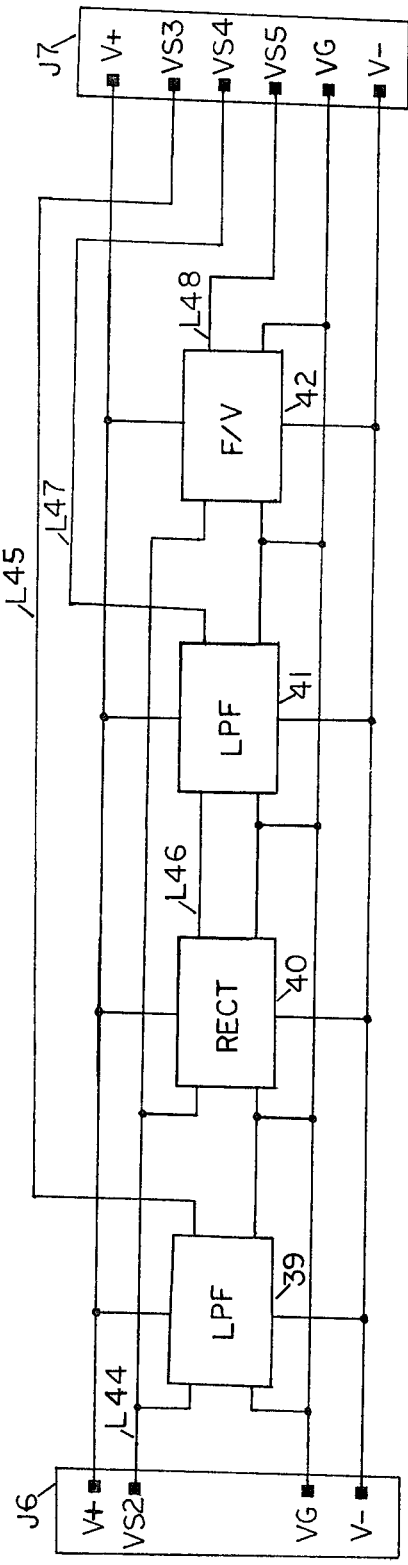

FIG. 10 shows a block schematic of a circuit means to derive equivalent DC signal corresponding to each of a combination of DC, AC and frequency signals available at a test node. This is for FIGS. 5A, 5B and 5C.

Figure 11:
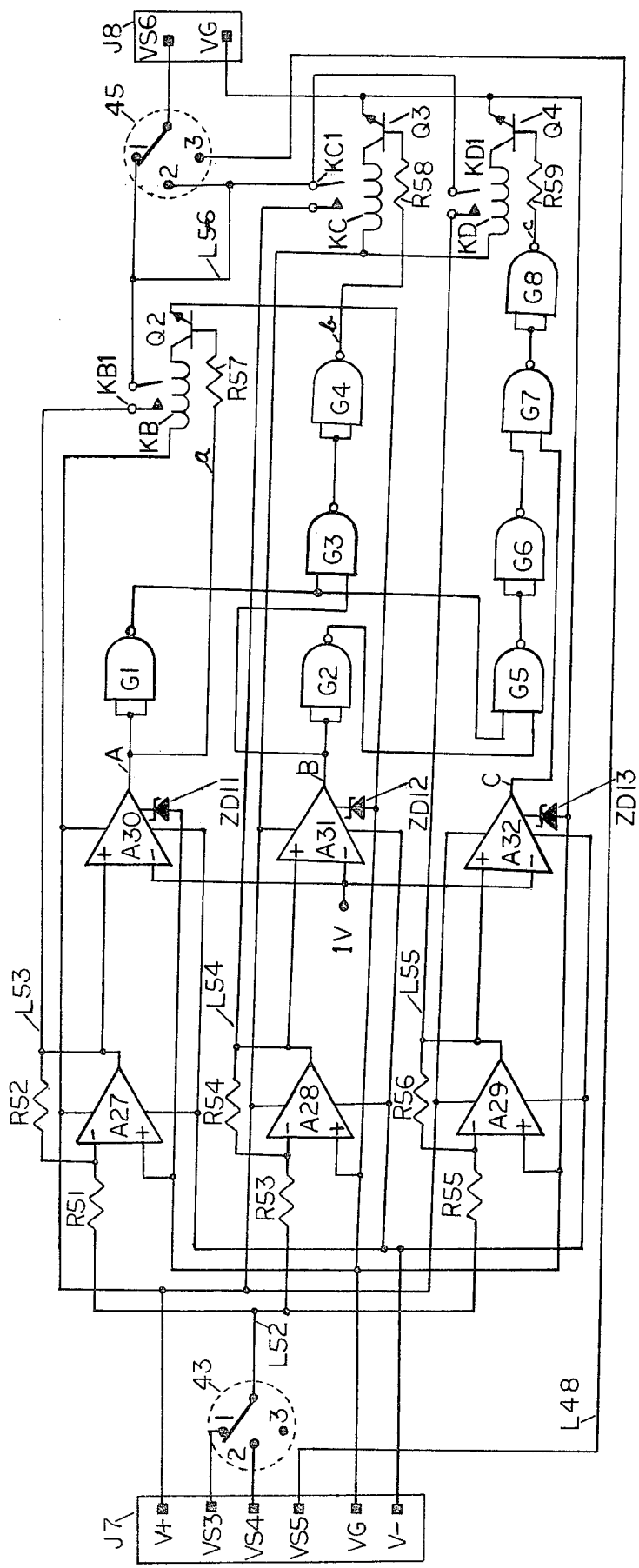

FIG. 11 shows a schematic of the signal scaler block, which also shows a switching technique of connecting the system in static, dynamic, or frequency test mode. This schematic is for FIGS. 5A and 5B, and requires a minor modification for FIG. 5C.

Figure 12:
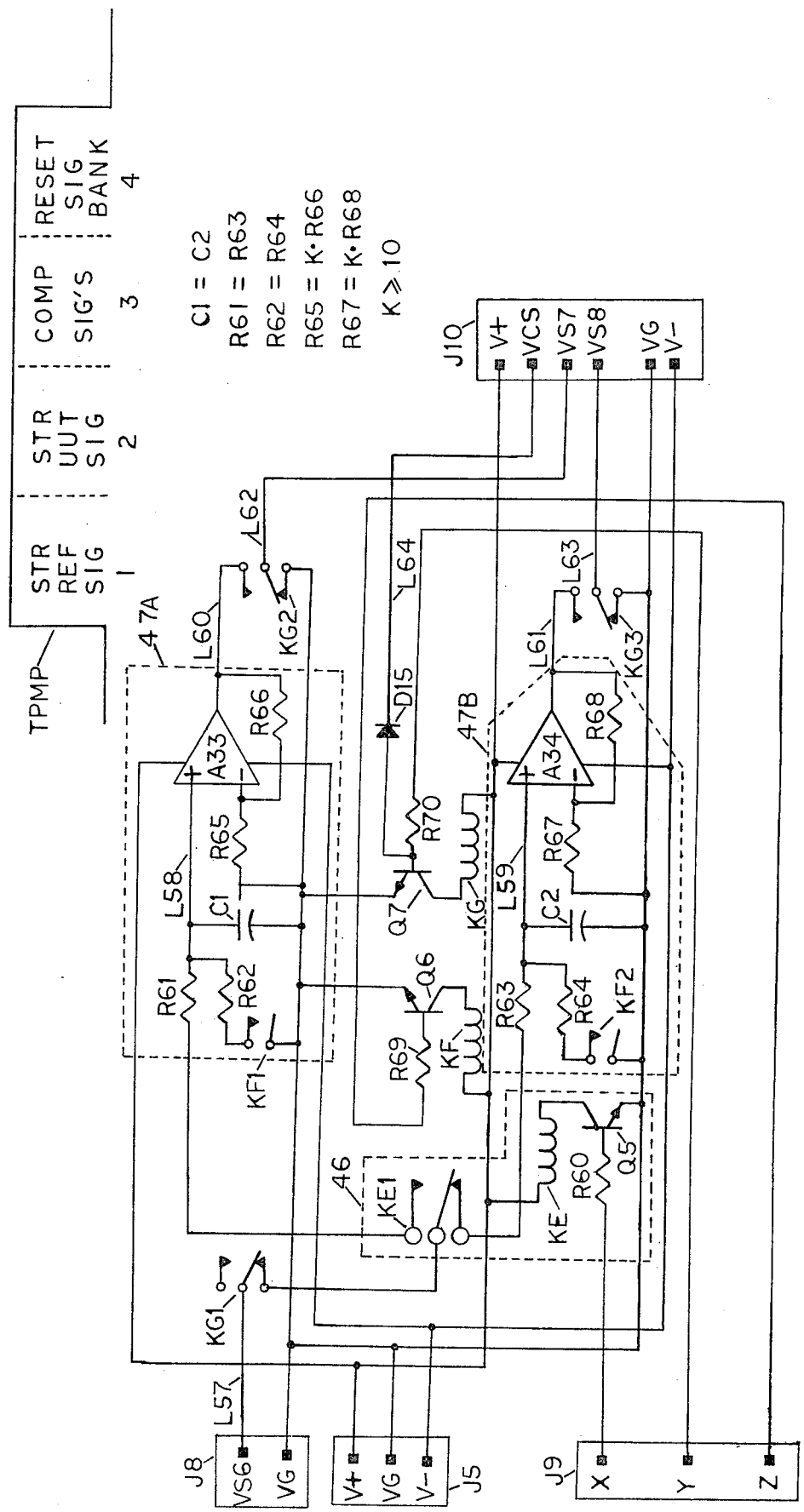

FIG. 12 is a schematic of demultiplexer and test signal storage circuits for the single channel system of FIG. 5B. This is not required for FIGS. 5A and 5C.

Figure 13:
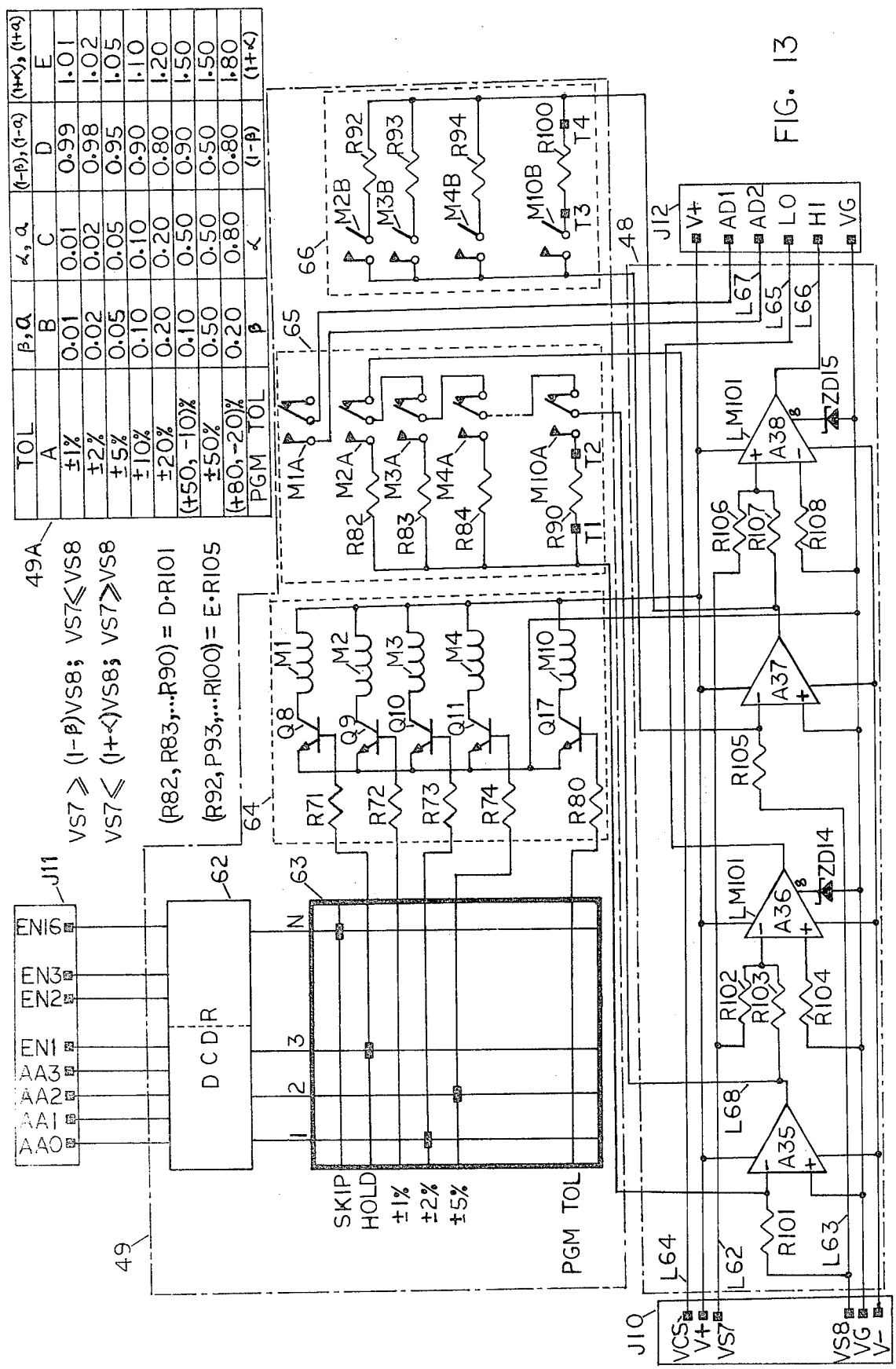

FIG. 13 is a schematic of the signal comparator and tolerance selector blocks, which also include tabulated data and related mathematical relationship for such blocks. This is for FIGS. 5A and 5B, but requires some improvement for FIG. 5C.

Figure 14:
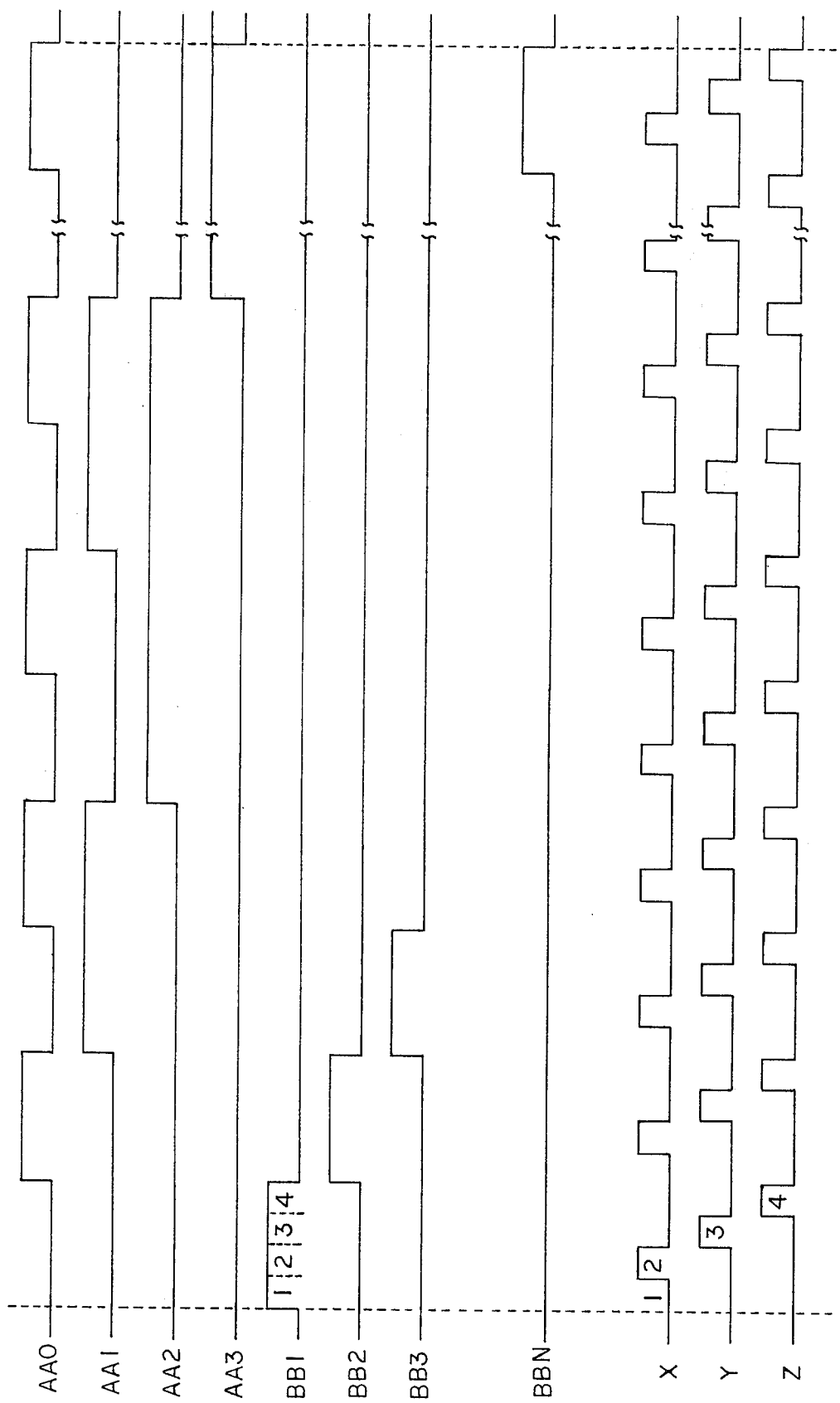

FIG. 14 is the timing diagram showing 4 bit address signals and corresponding test point multiplexing signals required to connect each of the 16 test points individually. This portion is applicable to the basic system, with 16 test points, of FIGS. 5A, 5B & 5C. In addition, FIG. 14 shows three timing diagrams for circuit multiplexing, test comparison and reset signals for FIG. 5B.

Figure 15:
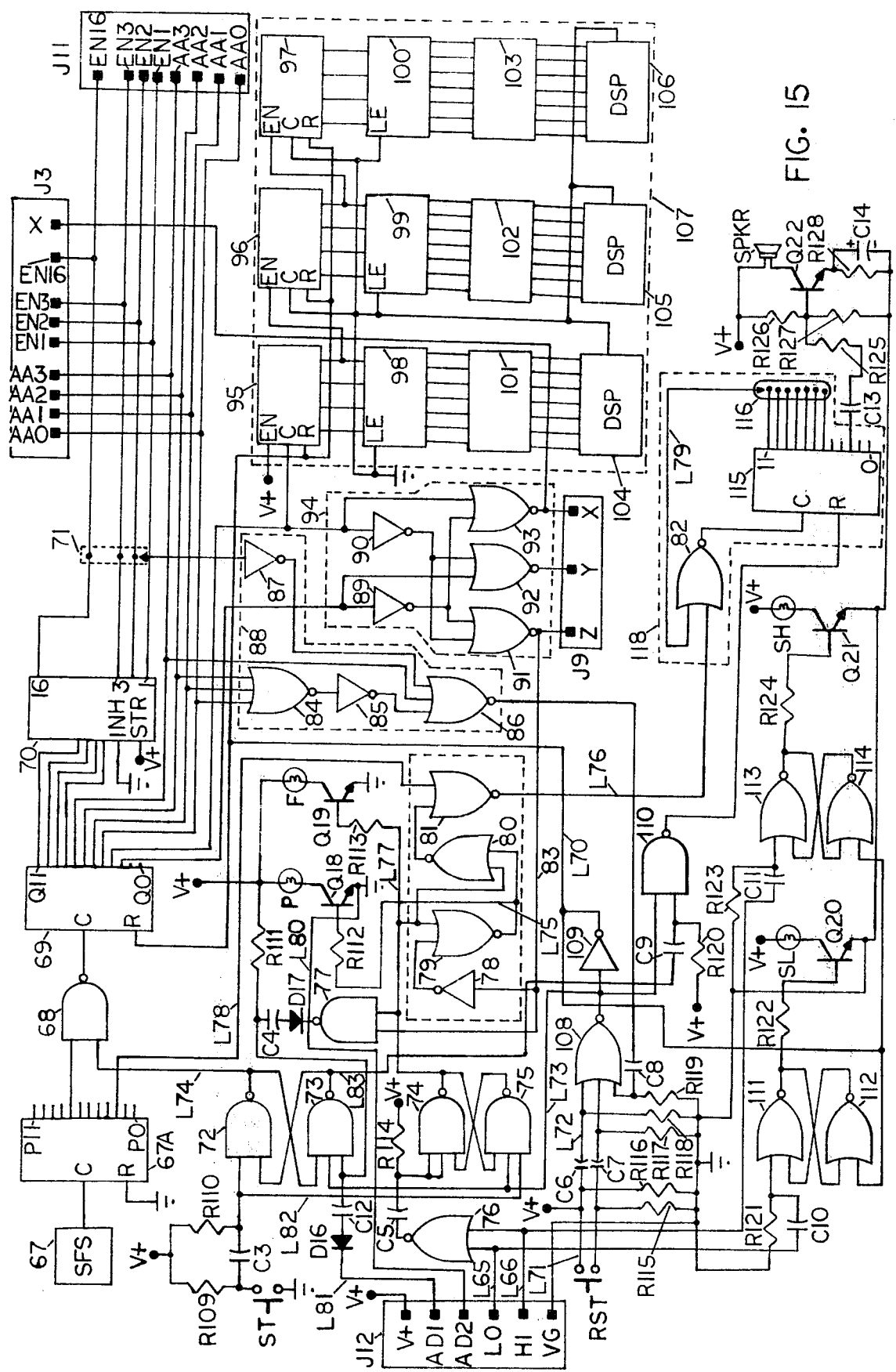

FIG. 15 is the schematic of the system control block. This is applicable to FIG. 5B and requires some alteration for FIG. 5A. FIG. 5C requires a computer/microprocessor software setup of system control.

Figure 16:
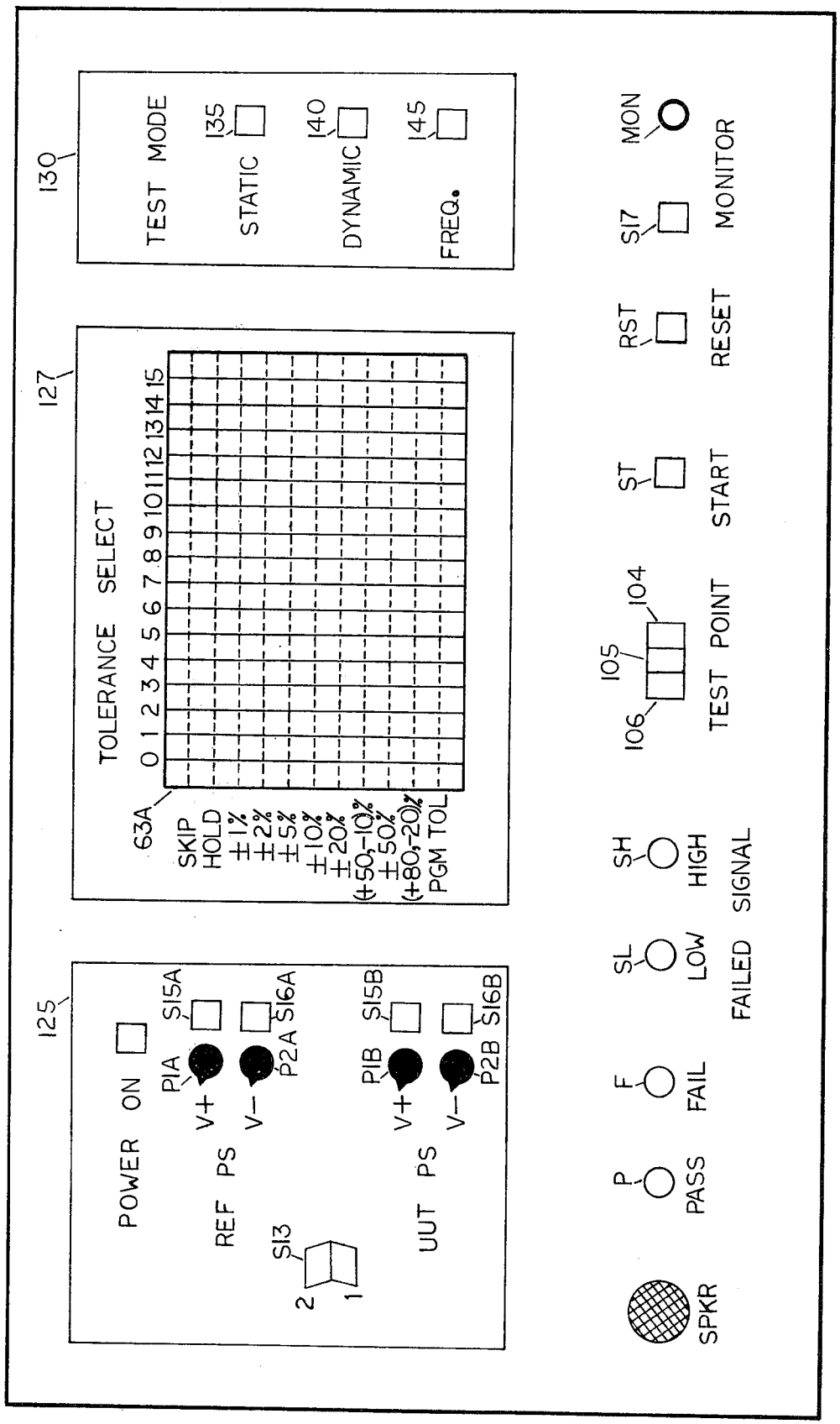

FIG. 16 is the front panel of the basic 16 point test system, consisting of different switches and controls. This is for FIG. 5A.

Figure 17A:
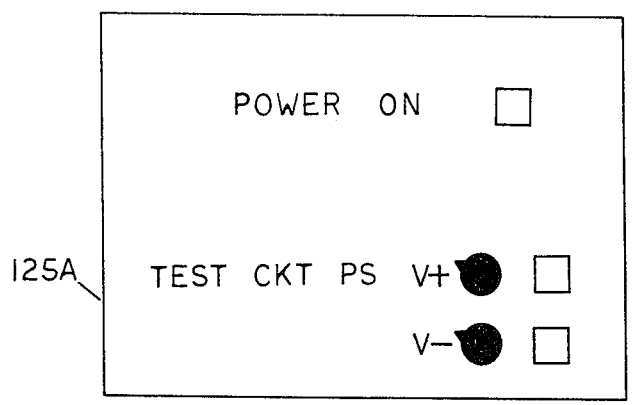
Figure 17B:
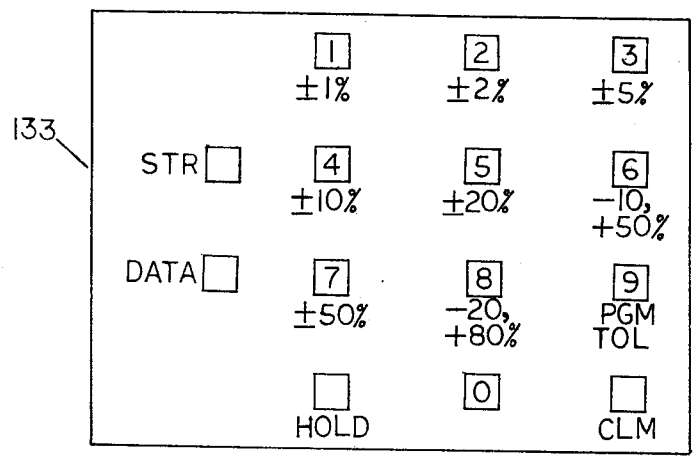

FIGS. 17A & 17B include modification in the front panel of FIG. 16 to make it adaptable for FIGS. 5B and 5C.

Modification or alteration in some of the figures, as stated above, have not been illustrated in diagrams, although such changes are covered in descriptive statements in the embodiment of the invention.

BRIEF DESCRIPTION OF ABBREVIATED TERMS

| | |
|---|---|
| A-ACTS | Automated Analog Circuit Test System |
| ACTS | Analog Circuit Test System, Automated |
| AC PS | Alternating Current Power Source |
| ATN | Attenuator |
| CC PS | Constant Current Power Source |
| CKT MUX | Circuit Multiplexer |
| COMP | Comparator, Basic Signal |
| COMP/MPCR | Computer/Microprocessor |
| C RDR | Chart Recorder |
| DCDR | Decoder |
| DP NG | DC Power Source, Negative Grounded |
| DP PG | DC Power Source, Positive Grounded |
| D/A CONV | Digital to Analog Converter |
| F MTR | Frequency Meter |
| F/V | Frequency to Voltage Converter |
| HI | Control signal output of comparator, which shows that failed test signal is higher than the pass band |
| INST | Instrument |
| INTFC | Interface |
| LO | Control signal output of comparator, which shows that failed test signal is below the pass band |
| LPF | Low Pass Filter |
| MON | Monitor |
| OSC | Oscillope |
| RC LD | Resistive-Capacitive Load |
| R-CKT | Reference Circuit |
| RECT | Rectifier |
| REF CKT | Reference Circuit |
| R-INT | Reference Circuit Interface |
| R LD | Resistive Load |
| RL LD | Resistive-Inductive Load |
| SFS | Stable Frequency Source |
| SIG BNK | Signal Bank |
| SIG CMP | Signal Comparator |
| SIG SCLR | Signal Scaler |
| SNK | Sink |
| SPKR | Speaker |
| SRC | Source |
| STR | Store or Strobe |
| SYST PS | System Power Source |
| TEST PT DMUX | Test Point Demultiplexer |
| TEST PT MUX | Test Point Multiplexer |
| TOL | Tolerance |
| TPMP | Test Point Multiplexing Pulse |
| U-INT | UUT Interface |
| USC | Unipolar Signal Conditioner |
| UUT | Unit Under Test |
| VC | Control Voltage from Signal Comparator |
| VCS | Skip Control Voltage |
| V MTR | Volt Meter |
| VR | Signal Voltage from Reference Circuit |
| VU | Signal Voltage from Unit Under Test |

DESCRIPTION OF THE PREFERRED EMBODIMENT

Figure 1:
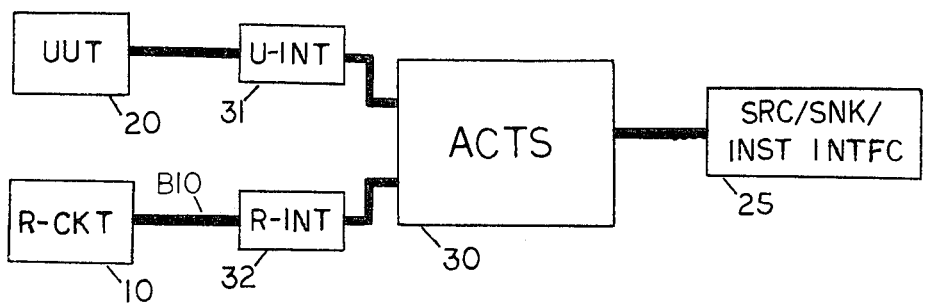
FIG. 1 is the basic block diagram which shows the interconnection of the Automated Analog Circuit Test System (A-ACTS) with associated circuits.

There is illustrated in FIG. 1 the basic block diagram of the Automated Analog Circuit Test System (A-ACTS) and its interconnection with the associated circuits. N number of test nodes of the Reference Circuit 10, hereafter called R-CKT 10, are connected to ACTS 30 through the reference circuit interface block 32. Interface block 32 may be just a connector with N pins and other end of the cable bus B10 is hardwired to respective nodes on the R-CKT 10. Alternately, nodes on R-CKT 10 may be connected through terminal blocks or quick connect terminals as well, if such provisions facilitate the testing. Corresponding nodes on the unit under test, UUT 20, are connected to ACTS 30 through UUT Interface 31. UUT Interface 31 may be a test fixture with spring loaded pins, suitably located to come in direct contact with the corresponding test points on a printed circuit board, when such a board is pushed down to make electrical contact with the pins of the test fixture, or it may have other means of connection for safe and desired speed of operation. It may be desirable to connect some nodes on UUT 20 and R-CKT 10 to an external AC or DC potential source or to an external reactive or resistive load. Additionally, a few nodes may have to be connected to external instruments. A method of connecting such means are shown in SRC/SNK/INST block 25. Detailed description of the circuit blocks 10, 20, 25 and 30 has been given below.

BASIC MATHEMATICAL MODEL OF THE SIGNAL COMPARATOR

Figure 2A:
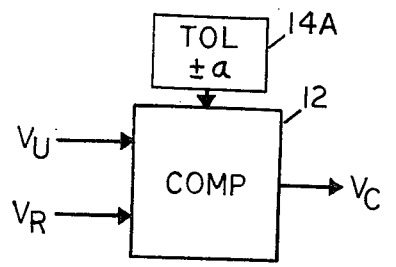
FIGS. 2A and 2C are block diagrams of the basic mathematical model under the bounds of even and uneven tolerance limits.
Figure 2B:
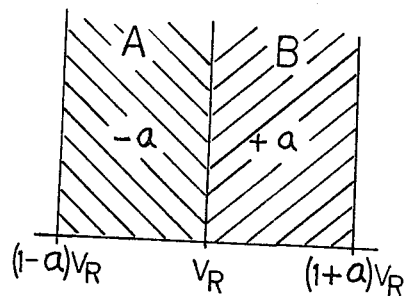
FIGS. 2B and 2D include graphical interpretation of the reference signal and its upper and lower limits with regard to FIGS. 2A and 2C.
Figure 2C:
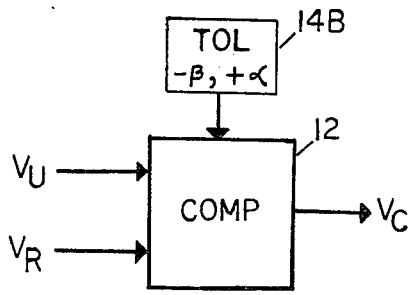

FIGS. 2A and 2C show basic block diagrams of the signal comparator. Taking only one test point and the corresponding reference point in consideration, signal voltages $V_U$ and $V_R$ represent the voltages available at the unit under test and the reference point respectively. Reference voltage $V_R$ has tolerance limits of $-a$ and $+a$ in FIG. 2A and $-\beta$ and $+\alpha$ in FIG. 2C. Bounds of the tolerance variation in FIGS. 2A and 2C will then be stated mathematically by $$-a \leq \frac{V_U - V_R}{V_R} \leq a \text{ for FIG. 2A, and}$$

$$-\beta \leq \frac{V_U - V_R}{V_R} \leq \alpha \text{ for FIG. 2C}$$

Figure 2D:
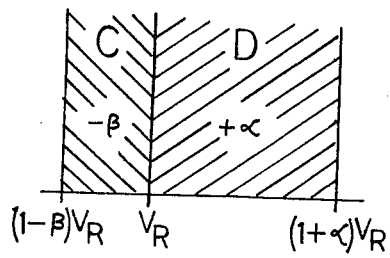

Acceptable extremities of $V_U$ for the two cases are shown in the graphical representations of FIGS. 2B and 2D. Signals must be compared with reference voltage $V_R$ and this divides the area of inequalities into regions A and B in FIG. 2B and regions C and D in FIG. 2D. Thus two basic relationships to be satisfied are,
 for negative tolerance region—

| $(1 - a)V_R \leq V_U$ | for Region A |
| $(-\beta)V_R \leq V_U$ | for Region C, and | for positive tolerance region—

| $V_U \leq (1 + a)V_R$ | for region B |
| $V_U \leq (1 + \alpha)V_R$ | for region D |

BASIC CIRCUIT REALIZATION OF THE MATHEMATICAL MODEL

FIG. 2A is a special case of FIG. 2C where $\beta = a = \alpha$. The circuit realization using relationships of regions C and D will thus be sufficient to cover the test criteria for even and uneven tolerance limits.

Figure 3A:
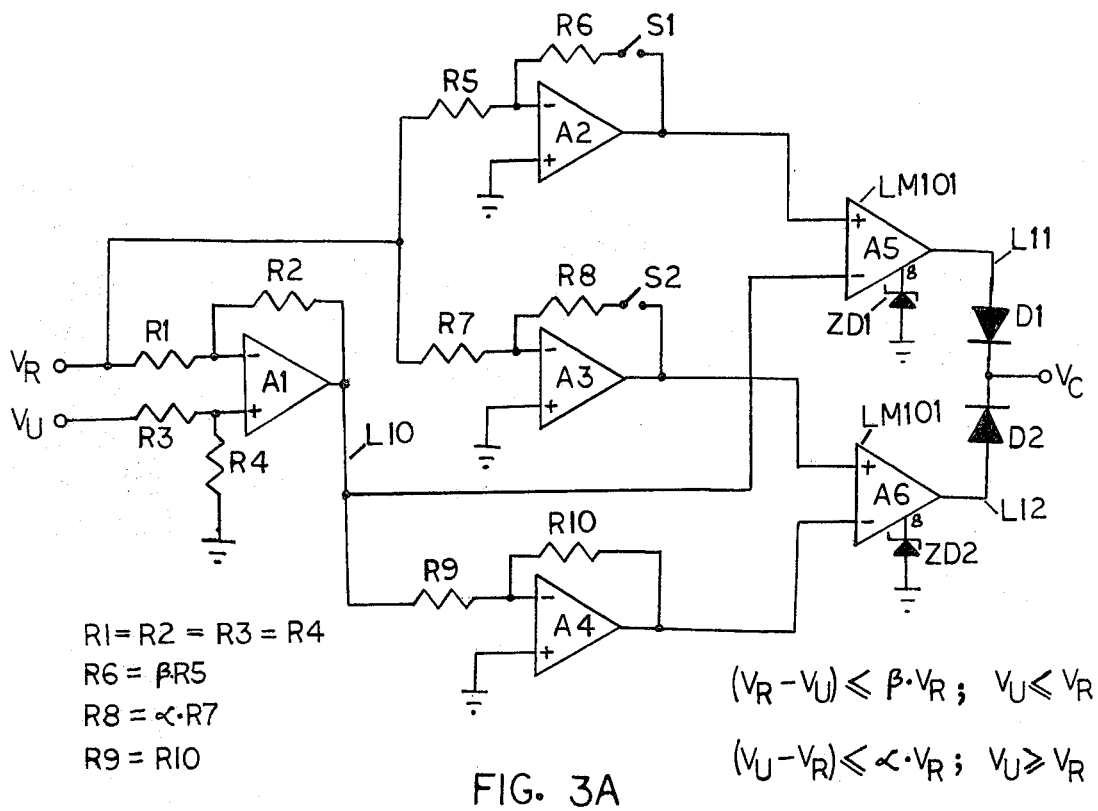
FIGS. 3A, 3B, 3C, 3D & 3E are five circuit diagrams derived from different interpretations of the basic mathematical relationship.

FIG. 3A gives a circuit schematic of the signal comparator employing the relationship

| $(V_R - V_U) \leq \beta \cdot V_R$ | for $V_U \leq V_R$, and |
| $(V_U - V_R) \leq \alpha \cdot V_R$ | for $V_U \geq V_R$ |

Alternately, this means to generate the control signal $V_C$ when

| $(V_R - V_U) > \beta \cdot V_R$ | for $V_U \leq V_R$, and |
| $(V_U - V_R) > \alpha \cdot V_R$ | for $V_U \geq V_R$ |

Referring to FIG. 3A and the mathematical relationships contained therein, the output of the operational amplifier A1 shall be $-(V_R - V_U)$ on line L10. This is applied to the inverting input of the voltage comparator 1A5 and the non-inverting input of the comparator A5 is supplied with signal $-\beta V_R$. For no output transition of A5, $-(V_R - V_U) \geq -\beta \cdot V_R$, i.e., $(V_R - V_U) \leq \beta \cdot V_R$. As soon as $V_U$ drops below $(1-\beta)V_R$, the inequality does not hold and switching at the output L11 occurs from zero to V+. Zener diode ZD1 is connected to clamp the output swing between zero and V+. If A5 is LM101 then ZD1 may be connected to pin 8 of LM101.

Instead of LM101, another operational amplifier and standard clamping circuits or switching comparator may be used in this circuit or other such circuits, which are described later, in order to generate a logic switching signal from comparison of analog signals.

Amplifiers A3, A4 and A6 in conjunction with A1 provide a switching signal for the second inequality $(V_U - V_R) \leq \alpha \cdot V_R$ when $V_U$ is greater than $V_R$. As soon as $V_U$ exceeds the upper bound of $(1+\alpha)V_R$, the voltage at output L12 of A6 swings up from zero to V+. By assigning different values to resistors R6 and R8, tolerances $\beta = R6/R5$ and $\alpha = R8/R7$ may be varied. This provides a means of introducing different tolerances by just switching different resistors R6 and R8 from a set of several resistors through a set of switches S1 and S2. Alternately, different tolerances may be assigned by switching resistors R5 and R7 as well, by keeping R6 and R8 fixed. The control signal $V_C$ thus covers the complete range of testability.

Figure 3B:
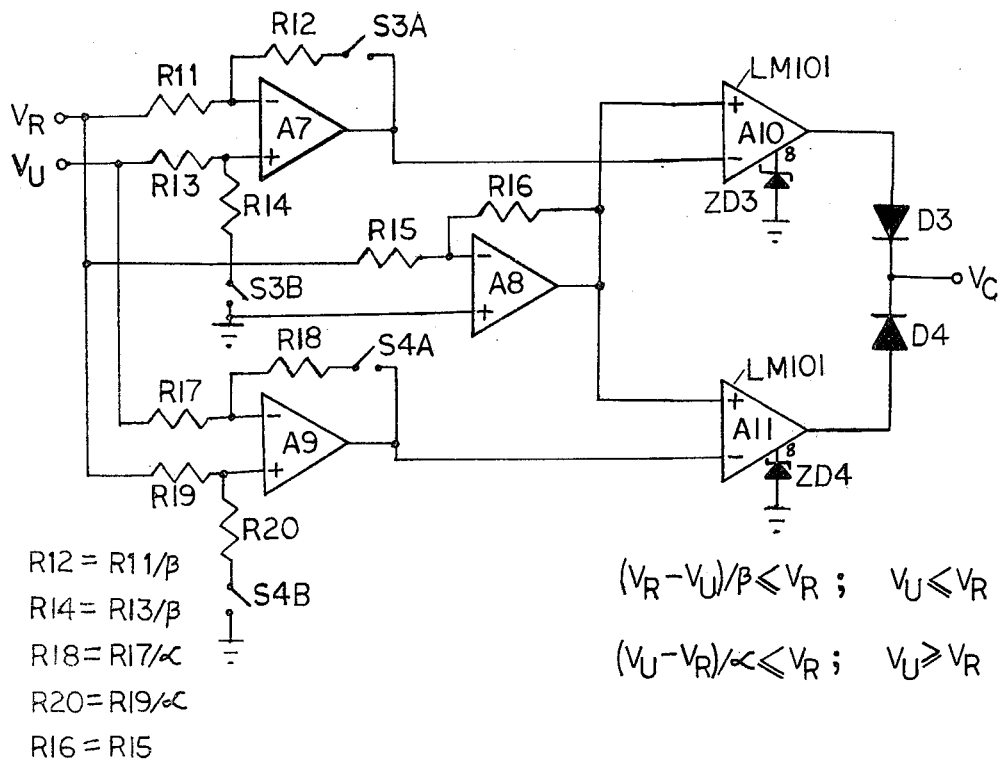

FIG. 3B is a schematic for the second setup of inequality

| $(V_R - V_U)/\beta \leq V_R$ | for $V_U \leq V_R$, and |
| $(V_U - V_R)/\alpha \leq V_R$ | for $V_U \geq V_R$ | to yield the same result. This schematic although uses five amplifiers A7 through A11, it suffers the disadvantage of requiring switching of four resistors R14, R16, R18 and R20, and thus involves additional circuits.

Figure 3C:
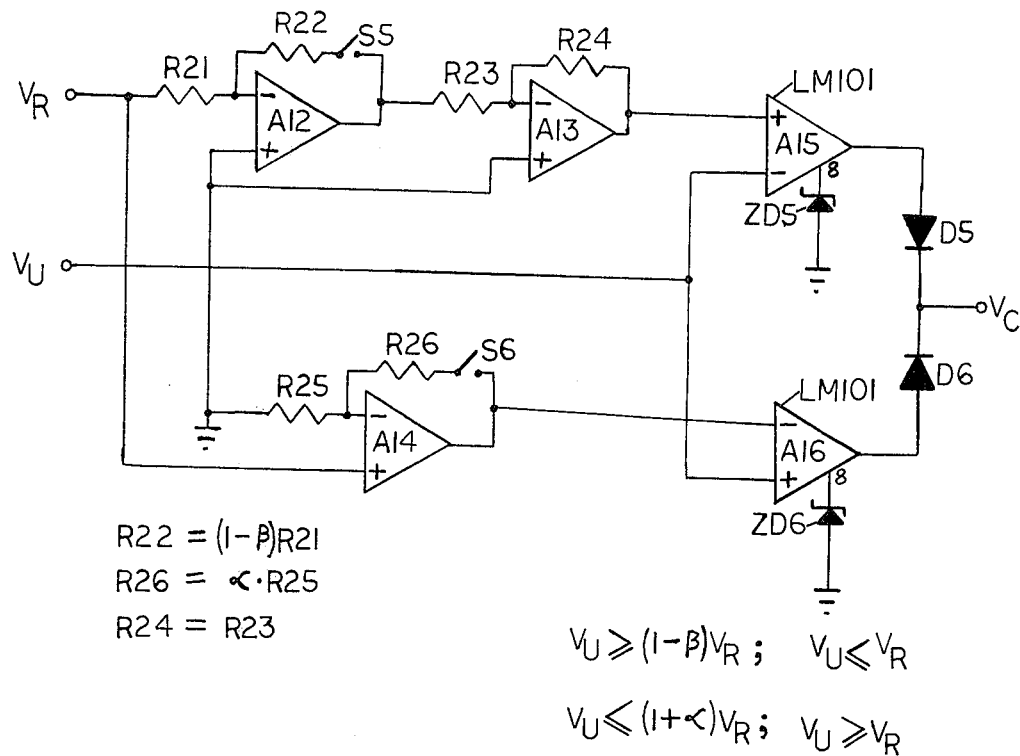
Figure 3D:
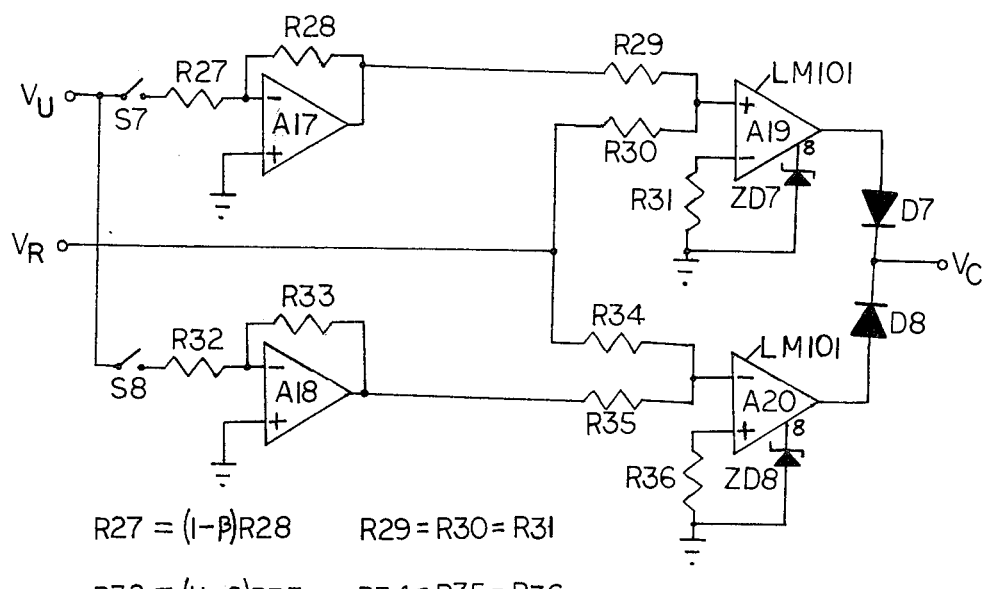
Figure 3E:
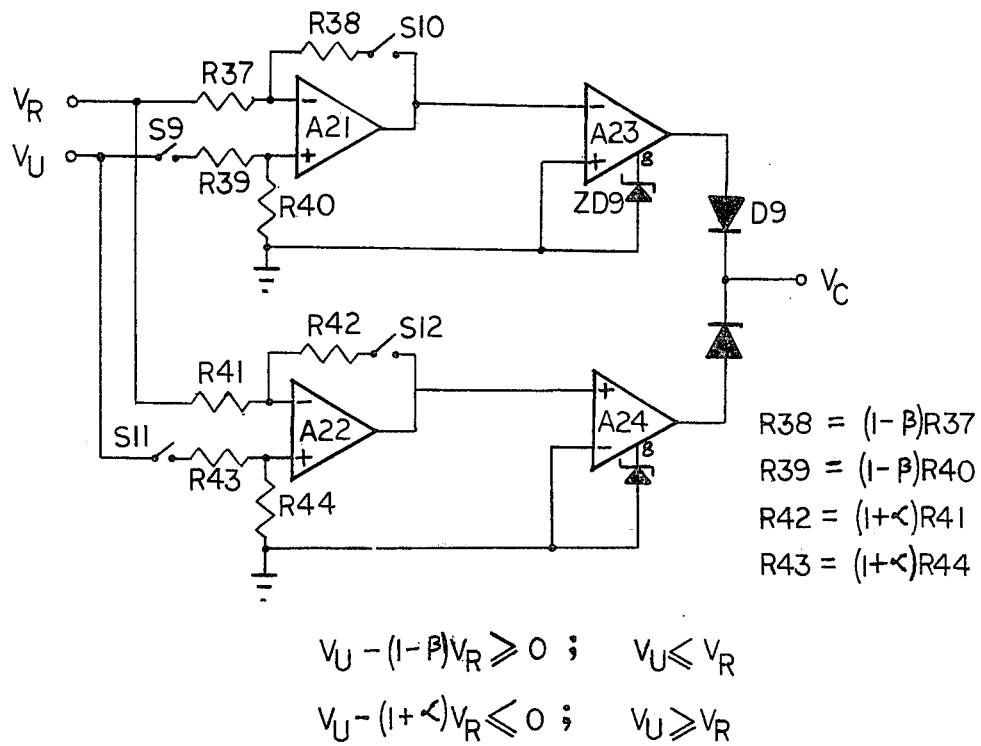

The inequalities for FIGS. 3C, 3D and 3E are

| Fig. 3C: | $V_U \geq (1 - \beta)V_R$ | for $V_U \leq V_R$ and |
| | $V_U \leq (1 + \alpha)V_R$ | for $V_U \geq V_R$, |
| Fig. 3D: | $V_U/(1 - \beta) \geq V_R$ | for $V_U \leq V_R$ and |
| | $V_U/(1 + \alpha) \leq V_R$ | for $V_U \geq V_R$, and |
| Fig. 3E: | $V_U - (1 - \beta)V_R \geq 0$ | for $V_U \leq V_R$ and |
| | $V_U - (1 + \alpha)V_R \leq 0$ | for $V_U \geq V_R$ |

Further explanation of FIGS. 3B, 3C, 3D and 3E is not essential as they include similar circuit components as in FIG. 3A and their explanations are based upon similar arguments. All mathematical relationships and component interrelationships are given in FIGS. 3A through 3E.

Although the drawings include five different detailed schematics for the same signal comparator, all are based on the same basic mathematical model, and it is not practicable to include all other possible circuits which could be derived by rearranging the basic comparator inequalities in different mathematical ways. As long as the basic mathematical inequalities are used to derive any other inequality to yield any other circuit, the inclusion of such circuit is automatically covered in this invention.

POWER SOURCE FOR TEST AND REFERENCE CIRCUITS

It is a common practice to use a constant voltage power source for test purposes. But if the test involves troubleshooting a circuit, the constant voltage source suffers some disadvantages. The main power or ground bus in a test circuit may be shorted or a portion of it may remain open. The short circuit could increase the inrush current to exceed the danger limit, which could ruin the circuit, or the open circuit could leave a portion of the circuit unenergized making it difficult to test such a portion of the circuit.

Figure 4A:
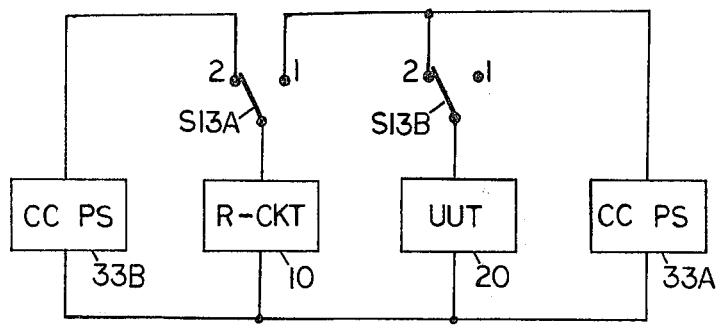
FIGS. 4A & 4B are block diagrams showing interconnection of the constant current power source with the Unit Under Test (UUT) and the Reference Circuit (R-CKT).
Figure 4B:
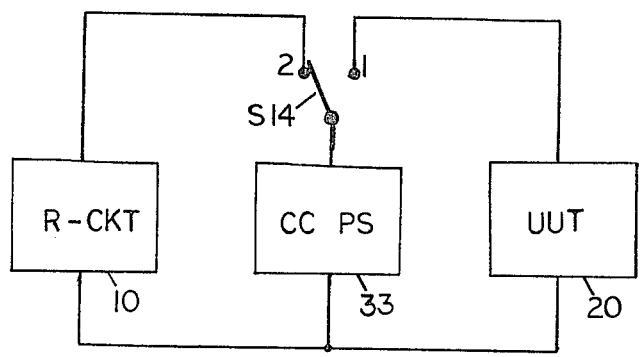

A constant current source, on the other hand, does not have such disadvantages. A good circuit with a fixed input resistance across its power supply terminals, when connected to a constant current source, whose current has been adjusted for the rated current of the circuit, will always generate the same fixed voltage across its terminals. On the other hand, if different test circuits with differing input resistances are alternately connected to the same adjustable constant current power source, adjusted to supply the same current for all circuits, they will exhibit differing voltages across their power supply terminals. A change in voltage from the rated nominal voltage could then easily be detected. Also, a short circuit will show too low a voltage, but will not damage the circuit as the circuit still takes the same rated current. An open circuit will show too high a voltage, which will not damage the circuit as the connection is open. The use of a constant current power source for non-precision test and comparison is illustrated in FIGS. 4A and 4B. The use of power source for precision test and comparison are given in the last paragraph of this section.

FIG. 4A shows how two different constant current power sources may be adjusted and finally connected to energize R-CKT 10 and UUT 20. By throwing the two pole switch S13A and S13B in position 1, the current level of the constant current power source 33A may be adjusted with the load of R-CKT 10 to a rated nominal voltage at its terminals. By throwing back the switch S13A and S13B to position 2, the constant current power source 33B may similarly be adjusted with the same R-CKT 10 connected as a load. This automatically connects UUT 20 connected to the constant current power source 33A. The test may now be initiated. This arrangement is for two channel sequential test system of FIG. 5A.

FIG. 5B requires only one constant current power source. Connection of such a power source is shown in FIG. 4B. Switch S14 represents a multi-plexing switch which alternately interconnects the same constant current power source 33 to R-CKT 10 and UUT 20. With multiplexing switch S14 in its normal position, its arm remains connected to R-CKT 10 at position 2. The current is thus adjusted for rated nominal voltage at the output. As soon as the start button ST of FIG. 16 is depressed, the switch S14 is moved by automatic means to position 1 after sampling the reference signal from its first test point, when it samples the test signal from the first test point of UUT 20, and the process repeated for other test points of R-CKT 10 and UUT 20.

It is important to mention here that static and dynamic signal levels at a typical test point in a circuit are assigned a certain nominal value when the main power bus feeding the test point has a fixed rated voltage. Thus practically all test voltage levels are referred to a constant voltage and not to a constant current of the rated power supply terminal. Testing signals at test points other than main power supply terminals with a constant current source connected to the power supply terminals would thus cause a little absolute error in measurement. Such errors will decrease further on account of comparison of the test and reference signals, i.e., because of relatively smaller differentials in errors, these may create some problems in precision testing of circuits when using a constant current source as the power supply.

The invention thus calls for (i) the use of a constant current power supply to compare and test the main power bus only to safeguard the circuit against short and open circuit hazards, and (ii) the use of a constant voltage power supply to test and compare all other test points when high precision testing is required. The accompanied drawings, although they do not show a constant voltage power supply for test and comparison, such supplies may be added across the same terminals where constant current supplies are connected.

OVERALL SYSTEM DESCRIPTION

Overall system diagrams are shown in FIGS. 5A, 5B and 5C. FIG. 5A is the two channel test system, which includes two sets of test channel means, one for UUT 20 signal processing and the other for R-CKT 10 signal processing. The system requires only one number of system power source 35A, signal comparator 48A, tolerance selector block 49A and logic control 50A. FIG. 5B, which is a single channel test system, includes single items of all circuit blocks of FIG. 5A and in addition, it includes circuit multiplexing block 36, test point demultiplexing block 46 and signal banks 47A and 47B. FIG. 5C, which is the computer or microprocessor controlled test system, includes all circuit blocks contained in the test channel of UUT 20 of FIG. 5A and in addition, it contains reference data block 10A, computer of microprocessor control 50C and D/A converter 51.

Detailed description of FIG. 5B is given below and possible alterations and additional details for FIGS. 5A and 5C will be covered where required.

Circuit multiplexing block 36 of FIG. 5B is designed in such a way that normally with no activation it connects all lines of bus B31 with the corresponding linees of bus B34. Thus constant current power source 33C and Source/sink/instrument block 25C remain automatically connected to R-CKT 10. Signals from R-CKT 10 are thus available at the input terminals of the test point multiplexer 37C. Depressing the start button generates an address signal for block 37C, which connects its output B41 to test point number 1 of the R-CKT 10. Attenuator and unidirectional signal conditioner block 38C attenuates the signal level by a factor of 10 and then provides a negative signal on bus B44, irrespective of the polarity of the signal on bus B41. For static, i.e., DC signal testing, the low pass filter 39C cleans out all AC components and leaves DC only on bus B45. For dynamic or AC signal testing, a coupling capacitor decouples DC out and AC signal fed to the input of a precision rectifier 40C which provides a rectified signal on its output bus B46. Low pass filter 41C now filters out all AC components and leaves an equivalent DC signal over bus B47. Switch 43C is used to put the test system in static test position 1 or dynamic test position 2. The signal available on bus B52 may be as low as 10 mV, which is quite in neighbourhood of the commonly available input noise voltage of a precision operational amplifier. Low signal to noise ratio may thus cause a serious problem at the comparator when precision testing with a low signal is required. Signal scaler block 44C scales up all signals to lie between 0.8 V and 9 V approximately on its output bus B56.

Frequency test is performed by transforming the frequency to a desired DC voltage and this is done by F/V converter 42C. Switch 45C selects the signal between bus B48 and B56. Test point demultiplexer 46 connects its input bus B57 to its output bus B63A. The processed reference signal is now stored on a precision capacitor installed in signal bank 47B.

Circuit multiplexer 36 now connects its output bus B34 to input bus B32, which is already connected to UUT 20 test points through UUT interface 31. A signal collected from test point number 1 through test point multiplexer 37C is now processed through the same test channel and demultiplexer 46 puts it this time on bus B62A. The signal is thus stored in signal bank 47A.

Upon completion of signal storage, the logic control 50B generates a test signal, which disconnects bus B57 from demultiplexer 46 and connects outputs of signal banks 47A and 47B to bus B62 and B63 respectively. Signal comparator 48B now receives processed signals from the test point number 1 of R-CKT 10 and UUT 20 over its input terminals. Tolerance select block 49B, which is already programmed for desired tolerances for different test points, is addressed from system control 50B at the commencement of the test point address signal, and this connects the desired tolerance selecting circuit corresponding to test point 1 to the signal comparator 48B. Signal comparator 48B is activated and puts a pass tone and a pass light or a fail tone and a fail light, as the case may be, on the front panel. In case of test failure, the fail signal on bus B65 locks up the logic control 50B and lights up low or high lamp on the front panel. This shows that the failed signal is lower or higher than the reference signal. This is an important information which in most of the cases immediately gives a clue to the cause of failure.

Whenever a test point fails the desired test limit, the system stops, which system may be restarted to perform a test on the next test point by depressing the start button again. By depressing the reset button, the system resets to its initial state and by depressing the start button it now starts the system from the first test point again.

The above description covers the basic description of FIG. 5A as well, as the interrelationship of all circuit blocks of FIG. 5A have been included. The signal comparator 48A here remains connected to two test channels through bus B57 and B157, and the pass or fail condition is displayed in the same way.

In FIG. 5C, the signal from UUT 20 is processed and finally received over bus B57 of the signal comparator 48C in the sme way as stated above. Here reference data corresponding to the signals at the reference points are fed to the computer through standard input systems such as a key board, floppy disc, magnetic tape, data crds etc. or in case of microprocessor controlled system, such data are fed through a key board located on the front panel. The computer or microprocessor collects the data & processes the through numerical methods. This replaces the analog processing network, but provides new data which are compatible with what is available on bus B57. Numerical processing includes various constants at block 38D, 40D, 42D and 44D of the test channel for UUT 20 of FIG. 5C. Such data available on line B201 of block 50C are fed into D/A converter 51, which converts the data to an equivalent DC signal. This appears on bus B257 and is fed to the input of the signal comparator 48C along with the other signal on bus B57. The output signal which appears on bus B265 controls the computer for documentation of the result. Computer output may be available in the form of computer print out & recorded on tape or may be available as ASCII characters for terminal display & remote transmission or finally, on other standard output systems. In the case of the use of a microprocessor, the result shall appear on the front panel in the same way as in case of the systems of FIG. 5A and 5B.

CIRCUIT AND SIGNAL MULTIPLEXING

Figure 6:
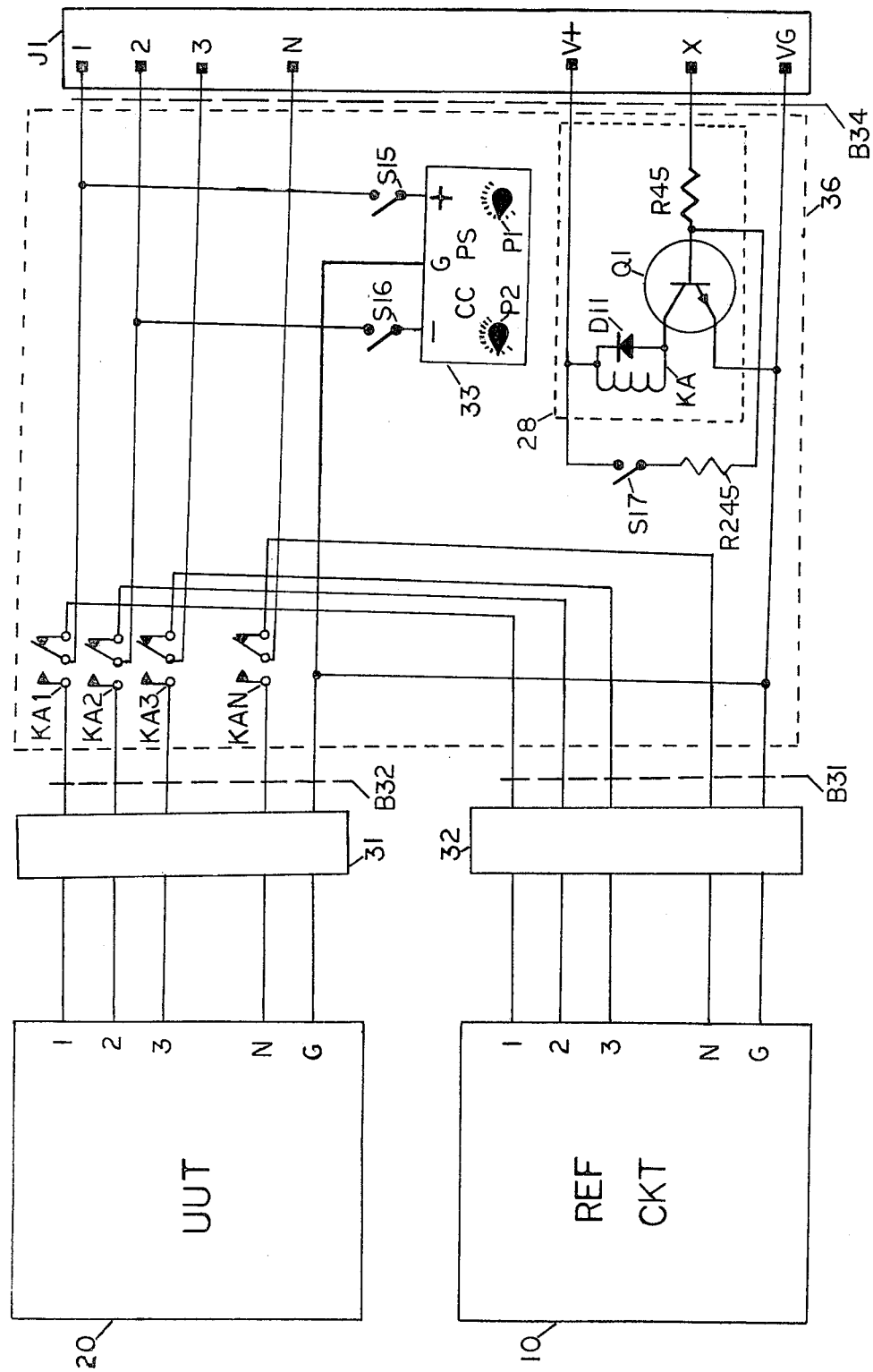
FIG. 6 is a schematic which shows multiplexing of the unit under test and the reference circuit and their interconnection with a constant current power source.

FIG. 6 illustrates the circuit diagram for circuit multiplexer block 36 and its interconnection with other associated circuits. All N number of test points require N channel multiplexing, where signals on output bus B34 are required to be derived alternately from buses B31 and B32. This may be achieved by N numbers of single pole double throw relay contacts, if accuracy is given more importance, or by N numbers of single pole double throw analog switches if speed is more important than accuracy. N numbers of output lines are connected to N numbers of input lines from UUT 20 and R-CKT 10 through relay contacts KA1, KA2, KA3 . . . KAN. All relay contacts are associated with the same relay driving circuit block 28, several of such circuit blocks may be cascaded across terminals V+, VG and X, and all such blocks driven by the same signal X. Proper size and number of transitors Q1, diodes D11, relays KA and resistors R45, which depend upon the quantities of the circuit block 28, are selected for safe operation of the relay driving circuit.

Constant current power 33 is a three terminal output source having positive, negative and common ground terminals. Currents on positive & negative lines may be adjusted by knobs P1 and P2. It may be easier to adjust the knobs for the desired voltage in the reference circuit rather than the desired current. While terminal G of the power source 33 is connected to the common ground line G of the system, terminals (+) and (−) are dedicated to test lines 1 and 2. Switches S15 and S16 are kept closed when UUT 20 and R-CKT 10 need both positive and negative power connection, otherwise only one of the switches is turned on for single power application. One of the test lines 1 and 2, thus not used for power connection, may be used to connect any other test point. A selected number of relay contacts and associated lines are designed to drive considerably higher current, so that such contacts may be used to connect higher current carrying external source or load to the UUT 20 or R-CKT 10.

Constant current power source 33, 33A, 33B, 33C and 33D, used in FIGS. 6, 5A, 5B and 5C, are the same except that 33A and 33B use switching scheme of FIG. 4A and 33C & 33D are connected in the same way as 33.

FIG. 7 shows a matrix switch 25P and its connection with the test bus B34 to ten different types of AC or DC power sources, resistive or reactive loads and different instruments. This scheme has the flexibility of setting the external device over any test point most conveniently by just moving the lever switch to the desired device position. Another scheme to fulfil the same objective is to provide N number of output terminals from the test bus B34, where the external device may be hardwired as desired and reconnected to other terminals if convenient.

SRC/SNK/INST blocks 25A, 25B and 25C of FIGS. 5A and 5B are similar to block 25 of FIG. 7, but block 25D requires a new design. Here T number of SRC/SNK/INST circuits are connected to N number of test points by using NXT number of normally open relay contacts, all driven by individual relays, which are driven by a memory, decoder and latch logics.

FIG. 8 is a schematic of the test signal multiplexer 37. This is used to sequentially connect one of the N test lines to output line L41. Relays K1 through KN and their contacts K1A through KNA are connected as shown to achieve multiplexing. Each relay is driven independently by one of the transistors QA1 through QAN, the base circuit of which is powered by pulses generated from decoder 61. Waveshape of these N pulses are shown in FIG. 14 and these pulses are designated by BB1 through BBN. Resistors RA1 through RAN control the base currents of transistors. Decoder 61 is a set of '4 of 16 decoders', each of which is driven by 4 bit pulses on lines AA0 through AA3 and an enable signal appears on one of 16 lines EN1 through EN16. This scheme shows the use of a maximum of 16 decoders to drive up to 256 lines. The circuit may be designed for 16 test points and expanded later to drive 32, 48, 64 ... 256 lines by using 2, 3, 4 ... 16 numbers of additional '4 of 16 decoders' and relay networks.

Outgoing terminals J1 and J2 of FIGS. 6 and 7, are connected to incoming terminals J1 and J2 of FIG. 8. Similarly, outgoing terminals J3 and J4 of FIG. 8 are connected to incoming terminals J3 and J4 of FIGS. 16 and 9 respectively. Line X is just a continuation line to transfer circuit multiplexer driving signal X to FIG. 6. FIG. 8 applies to circuit blocks 37C of FIG. 5B, whereas blocks 37A, 37B and 37D of FIGS. 5A and 5C are different only in that they do not have line X.

SIGNAL PROCESSING

The analog circuit test system, covered in this invention is meant for testing a circuit which may be powered from as low as a 1.5 V battery to as high as a 60 V DC power supply. The signal available on line L41 may be as low as 0.1 V DC or as high as 60 V DC. As the system components are not designed to withstand higher voltages, such signals must be attenuated to a desired lower value. FIG. 9 shows a schematic which includes an attenuator 62 and a unipolar signal conditioner 62A. Attenuator 62 is designed to drop its output signal by a factor of 10. The DC component of the output signal on line L42 may be positive or negative. It is desirable to have only one polarity of signal on line L44, irrespective of the polarity of signal on line L42. This is accomplished by unity gain amplifiers A25 and A26 of the unipolar signal conditioner 62A. Amplifier A25 generates a signal on line L43, which is equal in magnitude, but opposite in polarity to the signal on line L42. Signals on line L42 and L43 are now connected through signal diodes D12 and D13, and are fed to the inverting input of the amplifier A26. The diode connected to the positive signal becomes forward biased, whereas the other diode gets reverse biased. Thus the signal across resistor R48 is always positive, which sets the output signal VS2 on line L44 to negative polarity all of the time. Diode D14 is used to match the input and feedback circuit of amplifier A26. Circuit blocks 38A, 38B, 38C and 38D of FIGS. 5A, 5B and 5C are similar to the circuit block 38 of FIG. 9.

FIG. 9 also shows system power supply 35 and its connection to the test system. The power source may be of ±10 V DC, ±12 V DC or any other appropriate regulated voltage. The power supply output bus is divided into two branches, one branch to provide power to blocks 36 through 45 and the other branch to power blocks 46 through 50. System power supply blocks 35A, 35B and 35C of FIGS. 5A, 5B and 5C are similar to block 35 of FIG. 9.

FIG. 10 shows circuit blocks 39, 40, 41 and 42 along with their interconnection. Signal VS2 on line L44 contains DC as well as AC components. For a static test, the AC component must be removed from it. Similarly, for a dynamic test, the DC component must be removed and the AC signal be rectified and filtered. Low pass filter 39 cleans out all AC components and presents DC signal VS3 on line L45 for static testing. Rectifier 40, which carries a decoupling capacitor at its input terminal, removes DC and allows the AC component to appear at the input of the rectifier. The rectified signal appearing at the output of line L46 of rectifier 40 is filtered by the low pass filter 41 to present a DC output, proportional to the AC signal, on line L47. Frequency testing is done by frequency to voltage converter block 42, which receives the signal frequency from line L44 and produces a proportional voltage VS5 on line L48,. Input terminals J6 and J7 of FIG. 10 are connected to output terminals J6 of FIG. 9 and J7 of FIG. 11 respectively. Circuit blocks 39, 40, 41 and 42 of FIG. 10 are similar to the corresponding circuit blocks with suffixes A, B, C and D of FIGS. 5A, 5B and 5C. Detailed circuit diagrams of these blocks and of block 33 of FIG. 6 and blocks 35 and 62 of FIG. 9 are not given in this disclosure, as these may be designed by using conventional circuits.

FIG. 11 shows the detailed schematic of the signal scaler block 44 together with switches 43 and 45. Switches 43 and 45 are two poles of the same rotory switch, which has three positions corresponding to static, dynamic and frequency test. The rotory switch may be replaced by three separate two pole push button switches to perform static, dynamic and frequency test operations. Signal scaler 44 is used to scale the static or dynamic signal available on line L52 to a desired value between 0.8 V and 9 V DC approximately. For an input signal of magnitude 0.1 V to 60 V DC on line L41, the corresponding signal on line L52 shall be 0.01 V to 6 V DC. This has been divided into three ranges of 0.01 V to 0.08 V, 0.08 V to 0.7 V and 0.7 V to 6 V DC. Three amplifier circuits A29, A28 and A27 connected in parallel through three relay contacts KD1, KC1 and KB1 provide gains of 100, 10 and 10/7 to these three ranges of signals respectively. Scaled signals appearing on output lines L53, L54 and L55 of amplifiers A27, A28 and A29 are fed to three comparators A30, A31 and A32 respectively. The signals are compared with reference voltages of 1 V DC on these comparators. Switching signals A, B and C generate optimal priority signals a, b and c, such that $a=A$, $b=\overline{A}.B$ and $c=\overline{A}.\overline{B}.C$. The best priority signal $a'=A.\overline{B}.\overline{C}$, $b'=\overline{A}.B.\overline{C}$ and $c'=\overline{A}.\overline{B}.C$. or a second optimal priority signal $a''=A.\overline{B}.\overline{C}$, $b''=B.\overline{C}$ and $c''=C$ may be used as well, depending upon whether the limiting constraint on the upper and lower signal limits or the upper signal limit only is applied.

Signals a, b and c drive relays KB, KC and KD through transistors Q2, Q3 and Q4 and resistors R57, R58 and R59. Optimal priority logic signals a, b and c are such that only one of the contacts K81, K82 and K83 shall remain closed when the test signal on line L52 is 0.01 V DC or over this value. If the signal on line L52 is under 0.01 V DC, then none of the comparators will activate, which shall keep all relays de-activated. Thus no signal will appear on line L56. Schematics of circuit blocks 43, 44 and 45 are similar to such numbered circuit blocks entered with suffixes A, B, C and D in FIGS. 5A, 5B and 5C. Relationship of the input and output signals of amplifiers A27, A28 and A29, and the relationship between their resistors are tabulated in FIG. 11.

SIGNAL STORAGE AND COMPARISON

The signal channel test system of FIG. 5B must have a circuit means to store the signals from UUT 20 and R-CKT 10 before feeding them to comparator 48B. FIG. 12 shows of the circuits which include schematics of demultiplexer 46 and signal banks 47A and 47B. Each of the test point multiplexing pulses BB1 through BBN of FIG. 14 is subdivided into four sub-intervals. During sub-interval 1, the circuit demultiplexing relay KE of FIG. 12 and circuit multiplexing relay KA of FIG. 6 remain de-energized. The processed signal from R-CKT 10 thus appears across capacitor C2. Time constant (R63).(C2) is small enough to allow full charging during sub-interval 1. Relays KA and KE are energized during sub-interval 2 by signal X. This allows the processed signal from UUT 20 to be stored across capacitor C1. Amplifiers A33 and A34 have their high input impedance non-inverting inputs connected to capacitors C1 and C2 respectively. These amplifiers thus provide a slightly higher but proportional voltages on output lines L60 and L61. At the commencement of sub-interval 3, the compare relay KG is energized by the compare signal Y of FIG. 15. This disconnects the line L57 by opening contact KG1 and connects lines L60 and L61 to lines L62 and L63 respectively by closing contacts KG2 and KG3. Test signals are now ready to enter the signal comparator 48 of FIG. 13.

Signal VC on line L64 is used to hold transistor Q7 off and thus signal Y becomes ineffective. This is required when test operation of a particular test point is to be skipped. This shall be discussed later in detail. Capacitors C1 and C2 must be discharged completely before start of the next test sequence. This is accomplished in sub-interval 4. When control signal Z energizes relay KF, contacts KF1 and KF2 of it short the capacitors C1 and C2 through discharging resistors R62 and R64. The next test sequence begins at the same instant when control signal Z ceases, which opens capacitor circuits for the next operation.

Incoming terminals J8 and J9 of FIG. 12 are connected to corresponding outgoing terminals J8 of FIG. 11 and J9 of FIG. 16 respectively. Also outgoing terminals J10 of FIG. 12 are connected to incoming terminals J10 of FIG. 13.

The complete schematic and description of FIG. 12 is applicable to the test system of FIG. 5B only. FIG. 5A does not require such arrangement. Such a setup for FIG. 5C is given at the end of this section.

Signals stored in capacitors C1 and C2 of FIG. 12 are compared within their preassigned tolerance limits in the schematic of FIG. 13. Here circuit block 63 is a matrix switch with 10 or an appropriate number of rows and N number of columns. Each lever of the matrix switch must be moved to a position which corresponds with the tolerance limit of the corresponding test point. The arrangement shows eight different preassigned tolerances to be introduced and a selectable tolerance limit of the test setup to be programmed externally by the user, if it is desired to do so.

Decoder 62, which is similar to decoder 61 of FIG. 8, provides multiplexing signals BB1 through BBN, which are routed through metallic bars of the matrix switch 63 to drive the desired transistors Q9 through Q17 and corresponding relays M2 through M10 of circuit block 64. Amplifiers A35, A36, A37 and A38 are arranged to compare test signal VS7 and reference signal VS8 in the negative and positive tolerance regions. This schematic is similar to the schematic of FIG. 3D except that switches S7 and S8 are used in series with the feedback resistors R28 and R33. A series of such resistor switch networks are included in circuit blocks 65 and 66, which serve as selectable feedback resistor networks of amplifiers A35 and A37. Here one of the relays M2 through M10, when turned on, connects the corresponding resistors in the feedback path and provides the desired tolerance constraint on the signal comparator. Amplifiers A36 and A38 are connected as switching comparators. When the signal VS7 on UUT 20 test point is smaller than $(1-\beta)$ times the corresponding reference signal VS8 on R-CKT 10, the switching comparator A36 operates and its output L0 on line L65 swings to a positive switching level. Similarly when the signal on UUT 20 test point is greater than $(1+\alpha)$ times the corresponding reference signal on R-CKT 10, the switching comparator A38 operates and its output HI on line L66 swings to a positive switching level. Terminals T1, T2, T3 and T4 in circuit blocks 65 and 66 are brought out on the front or back panel of the test equipment. A user may now plug in desired values of resistors R90 & R100 in order to program a tolerance for the last tolerance set up.

It is desirable to skip testing for some intermediate test points or a series of last test points. In such a case, corresponding lever switches on the matrix switch board 63 are left on SKIP position. Outputs of decoder 62, corresponding to the lever switches in skip position, do not activate any of the relays in circuit block 64. Thus output line L68 of amplifier A35 remains connected through normally closed contacts M2A through M10A to line L64. As line L63 is grounded by normally closed contact KG3, FIG. 12, both inputs of the amplifier A35 are grounded. Thus output on lines L68 and L64 remains grounded. This grounds the base of transistor Q7 in FIG. 12, which keeps relay KG de-energized. Control signal Y thus do not connect the signals from signal banks to the signal comparator and thus, there is no pass/fail action. Signal comparison test for the test point in question has been skipped and the test operation for the next test point now commences.

It is desirable to monitor a particular test point in order to check the signals on UUT 20 or R-CKT 10 directly on an instrument connected to terminal VS on line L41, FIG. 8. For this, the lever switch corresponding to the test point address on the matrix switch board 63 is moved to HOLD position. As soon as the test point multiplex signal from a typical test point appears with the switch in the HOLD position, this action activates transistor Q8 and relay M1 of circuit block 64 and its contact M1A becomes closed. This generates a switching signal at the commencement of subinterval 1 and stops the multiplexer at the addressed test point count. Further details on switching signal generation is given below in the description of the system control section. Once the test point is addressed, the monitor push button switch S17, shown in FIG. 6, may be momentarily depressed to get a signal from UUT 20 on test terminal VS of FIG. 8. Releasing the push button puts a signal from R-CKT 10 on the test terminal VS. Both signals may thus be indicated on the same instrument by just the push of the monitor button S17.

FIG. 13 also contains the inequality relationships of the test and reference signals and relationship between various feedback resistors and input resistors R101 &

R105 of amplifiers A35 and A37. Constants D & E may be selected for different tolerances from the tabulated data shown in block 49A.

The signal comparator and its associated circuits of FIG. 13 are applicable to two channel multiplexed test system of FIG. 5A with the exception that the skip signal VCS on line L64 will be used to inhibit the operation of a different relay, which shall be similar to relay KG of FIG. 12. The purpose of this relay shall be to normally keep the input lines L62 and L63 of the signal comparator disconnected from the signal processing unit. These input lines shall be connected to comparator after the elapse of a fixed time interval, shorter than the interval of a multiplexed pulse, and such time interval shall be measured from the start of the multiplexed pulse of the test in progress. The purpose of this time interval shall be to allow low frequency signals and super-imposed switching over AC signals a sufficient time to generate a fairly stable processed DC signal for comparison. Signal X already has such a provision in FIG. 5B and no extra time interval is required there.

FIG. 5C does not require the complete schematic of FIG. 13. Circuit blocks 48, 64, 65 and 66 will be used in the same way but blocks 62 and 63 may be substituted by circuits consisting of keyboard control and random access memory. Keyboard shall be used to enter bits corresponding to tolerances in the random access memory. Multiplex address bits are used to extract tolerance bits to drive a decoder which shall drive relays M1 through M10. This scheme also requires a time interval, as discussed above for FIG. 5A, during which digital to analog converter provides a DC processed signal corresponding to reference data for the test point and low frequency signals have sufficient time to provide stable UUT processed signal.

SYSTEM CONTROL

System control logic is contained in FIG. 15. Block 67 is a stable frequency source, which provides a reasonable frequency clock signal to drive a free running 12 stage binary counter 67A, which generates 12 different frequencies P0 through P11, some of which may be selected to control the system logic. The schematic of FIG. 15 shows the application of only two frequencies, which may be selected from outputs of block 67A, as desired. Nand gate 68 controls the clock input to the logic system and is used as a means to start and stop the sequential count of multiplex pulses. Block 69, which is a second 12 stage binary counter, provides 12 bit signals Q0 through Q11. Bits Q4 through Q7 are signals AA0 through AA3, which are address signals for decoders 61 and 62 of FIGS. 8 and 13. Timing diagrams of this 4 bit signals are shown in FIG. 14. Bits Q8 through Q11 drive a '4 of 16 decoder' 70, which provides 16 enable signals EN1 through EN16 for decoders 61 and 62 and circuit block 88. Bits Q2 and Q3 are fed to logic block 94, which is used to generate signals X, Y and Z of FIG. 14. Bit Q3 is at the same time, used to clock the 4 bit BCD counter 95. Logic block 107 has an arrangement to provide 3 digit decimal count of the test point. Blocks 95, 96 and 97 are 4 bit BCD counters, 98, 99 and 100 are 7 segment decoders, 101, 102 and 103 are resistor networks and 104, 105 and 106 are digital displays. Reset signal on line L70 is used to reset the counters 95, 96 and 97.

Capacitor C6 on the first input of gate 108 generates a power-on reset signal. When power turns on, line L71 goes high immediately, but line L72 generates a high to low signal, which produces a reset signal and its complimentary signal on line L70 and L73 respectively. Capacitor C7, similarly provides a manual reset signal on lines L70 and L73 when switch RST is depressed momentarily. Also bits corresponding to counts 16, 32, 48 ... 256, from signals AA0-AA3 and the next of the highest order enable signals EN1-EN16, which is derived from block 71, are used to generate the end-of-cycle reset signal from the logic block 88. As an example, for 16 and 32 test point systems, the input line to inverter 87 will be tapped from EN2 and EN3 lines of block 71 respectively. The end-of-cycle reset signal so generated, is applied through capacitor C8 to the third input of gate 108. Signals on lines L70 and L73 serve as the master reset signal and are required to reset all the necessary circuits.

The test system is started by depressing the start button ST, which generates a high control signal on line L74 of the latch 72-73. This enables the gate 68 to pass a clock signal for counter 69. When system passes a test, a normally low signal level on line L77 of gate 74 and complimentary output of signal Z passing through gate 79 generate a pass signal on line L75 to turn on the pass lamp P. This remains ON during sub-interval 4, i.e., as long as Z remains high. The outputs of gates 74 and 79 pass through gate 80, the output of which when passes through gate 81 along with a selected audio frequency from block 67A to provide a short duration clock on line L76 to drive a 12 stage binary counter 115 through gate 82. Logic circuit 118 provides 12 divide-by-2 frequencies, either or a combination of which are used to drive speaker SPKR through transistor Q22 connected as an amplifier. This provides an audible pass tone during sub-interval 4 of the multiplexed pulse duration.

In case a test point fails the test, the signal comparator of FIG. 13 generates a positive signal LO or HI on lines L65 or L66. This passes through gate 76 and provides a positive signal on output line L77 of latch 74-75. This signal passes through gate 77 as long as signal Z is high and resets the latch 72-73, which disables gate 68 to stop the counting sequence. The digital display in blocks 104-106 stay ON, fail light F turns on and the audio frequency on line L78 passes through enabled gate 81 over line L76 to generate fail audio tone through speaker SPKR. The tone remains ON for a fairly large amount of time to distinguish it from pass tone. The duration of this is adjusted by connecting the enable signal of gate 82 on line L79 to either of the higher significant bit terminals at tapping 116 of block 115. Alternately, ANDed outputs of the multiplicity of the binary outputs of counter 115, that correspond with a typical count and which is not shown in schematic, may be combined to generate disable signal on line L79, if a duration of the fail tone other than that provided by a single output at tapping 116 is desired. The fail tone stops as soon as the signal on line L79 changes to high level.

Tappings 71 and 116 may be replaced by a multiplicity of the poles of the DIP switch interconnection, which makes the user more convenient to change the end-of-cycle count as well as the duration of the fail tone. This is done by just turning on the desired switch or set of switches, as required.

Lamps SL or SH provide indication of the existence of low or high level of the failed test signal beyond the reference signal from UUT 20, when a test point fails the test. For this, latches 111-112 or 113-114 are used to hold transistors Q20 or Q21 on. The latches are set by signals on lines L65 or L66 and are reset by master reset signal on line L70.

In the event when a test point is addressed to hold the signal on terminal VS of line L41, FIG. 8, the desired lever on the matrix switch 63 is brought on position HOLD and start button is depressed. This advances the test and when it reaches the test count of the hold position, the signal from decoder 62 passes through HOLD bar of the matrix switch 63 and energizes the relay M1, which closes its contact M1A. This transmits a ground signal through lines L80 and L81 and diode D16 to reset input of latch 72-73. This immediately pulls down line L74 to low level, which disables the gate 68 and stops the test operation at the test count corresponding to HOLD position of the lever switch. Once the lever switch is placed in HOLD position, the system does not receive any value of the tolerance of the test point in question and thus, the comparison test can not be initiated. HOLD function may thus be used in conjunction with monitor function as an auxiliary test step.

In addition to master reset signals at line L70 and its complimentary signal on line L73, some local reset signals are required. Depressing the start switch ST generates reset signals on lines L82 and L83 around latch 72-73. These signals reset latch 74-75 and audio tone counter block 118. MSI logic integrated circuits, which are used in FIG. 15, are provided with the desired polarity of enable, strobe and inhibit signals.

Control logic schematic of FIG. 15 may be used for two channel test system of FIG. 5A, except that signals X and Y are not required and may be omitted. Signal Z shall however be used to control gates 77 and 78.

Control logic for FIG. 5C shall be different from what is stated in FIG. 15. This requires a set of software programs to execute all operations. Such programs shall generate slow frequency address signals for multiplexers, display signals to drive numeric displays, signals to control display lamps, generate and control audio tones, generate reset operations including controlling the computer or microprocessor operation with input signals on lines L65, L66, L80 and L81. These programs may be stored in PROM, ROM, magnetic tape, floppy disc or other storage device of the related control system.

FIG. 16 contains the diagram of the front panel with switches, displays and other control devices. This figure is although applicable to the two channel system of FIG. 5A, the major portion of it is applicable to the system of FIG. 5B and the microprocessor system of FIG. 5C. All the switches, levers, control knobs and indicating devices have been identified earlier and their operation has been explained.

FIG. 17A contains switches and controlling devices for the power supply of the single channel system of FIG. 5B. Block 125 of FIG. 16 when replaced by block 125A of FIG. 17A and the panel so obtained, in conjunction with other switches and controls of FIG. 16, becomes the front control panel for the single channel system of FIG. 5B.

FIG. 17B contains block 133 and two switches labelled STR and DATA. Switches and controls of FIGS. 17A and 17B are used to replace blocks 125 and 135 of FIG. 16 in order to make this panel applicable to the microprocessor controlled system of FIG. 5C.

Switches and control knobs labelled TEST CKT PS in block 125A of FIG. 17B, when used in FIG. 5C, control the UUT circuit only. A tolerance value or hold function is stored here by depressing the STR button, related test point address number, DATA button and the numeric button corresponding to the tolerance or hold function, noted under such buttons, for the test point, all in sequence. This process is repeated until all such tolerances or hold functions are stored in the memory. Test point address numbers for which a tolerance or hold function is not stored, become automatically subject of being skipped. This method thus, does not require a separate SKIP position. All entries in the memory, entered through the key board, is cleared by depressing the CLM button and a new set of entries may now be made.

The front panel of the computer controlled system is not presented here as this depends upon how much of the software work should replace the system operation and what type of input/output peripheral devices be used.

I claim:

1. A device for testing a circuit having a plurality of test points comprising:
    means for applying power to said circuit from a selected one of a plurality of sources;
    a signal tolerance comparator means for comparing signals from said test points to reference signals within a presented tolerance band; and
    means for sequentially coupling said signal tolerance comparator means to said test points through a signal processing means, said signal tolerance comparator means sequentially providing a signal indicative of whether said signals are within a selected tolerance of said reference signals respectively.

2. The device according to claim 1 additionally comprising signal tolerance selection means for selecting a particular tolerance for each test point respectively.

3. The device according to claim 2 wherein said signal tolerance selection means comprises a matrix switch having a plurality of fixed, standard tolerance selections for test signals.

4. The device according to claim 3 further comprising arbitrary tolerance selection means enabling nonstandard tolerance selection through external means.

5. The device according to claim 2 wherein said signal tolerance comparator means comprises first and second linear amplifier means and first and second comparator means coupled respectively to said first and second linear amplifier means, and said signal tolerance selection means comprising means for coupling a plurality of selected resistors to said linear amplifier means.

6. The device according to claim 5 wherein said plurality of selected resistors comprise at least a feedback resistor for each of said first and second linear amplifier means, said feedback resistors acting to change the gain of said first and second linear amplifier means to account for positive and negative tolerance beyond said reference signal.

7. The device according to claim 5 wherein said selected resistors include input resistors for said first and second linear amplifier means, said input resistors acting to change the gain of said first and second linear amplifier means to account for positive and negative tolerance beyond said reference signal.

8. The device according to claim 2 wherein said signal tolerance selection means selects tolerance as a percentage deviation from a nominal value obtained from said reference signal value.

9. The device according to claim 1 wherein said means for applying provides a constant current power source to said circuit under test to protect said circuit under test from possible burn-out due to the presence of a short circuit fault in said circuit under test.

10. The device according to claim 1 wherein said means for applying provides A.C. and D.C. voltages and external signals to said circuit under test that are the same as are applied when said circuit under test is in an actual operating mode, said device further comprising means for coupling external loads to said circuit under test, said external loads being the same as present during an actual operating mode.

11. The device according to claim 1 further comprising a reference circuit for supplying said reference signals to said device for testing, said means for sequentially coupling including circuit multiplexer means for multiplexing both said reference signals and said test point signals.

12. The device according to claim 1 further comprising a reference circuit for providing said reference signals to said device for testing, and a pair of test point multiplexer means for independently multiplexing said reference and said test point signals.

13. The device according to claim 1 further comprising a signal processing means coupled between said sequential coupling means and said signal tolerance comparator means, said signal processing means including multiplexer means, alternator means, unipolar signal conditioner means, D.C. and A.C. signal isolating means, signal rectifying and filtering means, signal scaling means, frequency to voltage signal conversion means and processed test and reference signal storage means, interconnected to provide three distinct channels for static, dynamic and frequency signal processing which may be selectably switched.

14. The device according to claim 13 wherein said signal scaling means comprises a plurality of amplifiers having different constant gains, a plurality of comparator means, one of said plurality of comparator means being coupled to each of said plurality of amplifiers, respectively, said comparator means acting to detect the presence of a preassigned input signal for said amplifiers, logic circuit means coupled to said comparators for generating predetermined switching signals, and test signal switching means coupled to said logic circuit means for selecting which of said amplifiers provides an output signal for said signal scaler circuit.

15. A device for testing a circuit comprising means for applying to said circuit A.C. and D.C. voltages corresponding to voltages applied to said circuit when in an actual operating mode, means for coupling external loads to the circuit corresponding to loads coupled to the circuit when in an actual operating mode, means for receiving from the circuit under test signals corresponding to signals provided by said circuit when the circuit is in an actual operating mode, means for comparing said signals obtained by said means for receiving with corresponding reference values, means for assigning different tolerances for said signals received, and means for indicating an improperly operating circuit when said received signals are beyond said reference values by amounts exceeding said assigned tolerances.

16. A method of testing a circuit comprising the steps of, supplying a constant current to a reference circuit having a pair of terminals, measuring the voltage across said pair of terminals of said reference circuit, adjusting said constant current to obtain a rated voltage for said voltage across said pair of terminals, supplying said constant current to said circuit to be tested, measuring a voltage across a pair of corresponding terminals of said circuit under test that corresponds to the voltage across said pair of terminals on said reference circuit, and determining if said unit under test is operating properly by determining if the measured voltage therefrom is within a selected tolerance of said rated voltage.

17. The method according to claim 16 wherein each of said pair of terminals comprises a main power bus.

18. A signal scalar circuit comprising a plurality of amplifiers having different gains for receiving an input signal, a plurality of comparators coupled to said amplifiers respectively, logic circuit means coupled to said comparators, and means coupled to said logic circuit means for selecting which of said amplifiers provides an output signal for said signal scalar circuit.

19. A method for testing a circuit having a plurality of terminals comprising the steps of, selecting a terminal to be tested from said plurality of terminals, sequentially scanning said plurality of terminals, stopping said scanning upon reaching said selected terminal, indicating a condition of a signal from said selected terminal, specifying a condition of a corresponding reference signal and comparing said condition of said signal from said selected terminal and said condition of said reference signal.

20. Apparatus for testing a circuit having a plurality of terminals, said apparatus comprising scanning means for sequentially scanning said plurality of terminals, selecting means for selecting a terminal to be tested from said plurality of terminals and for stopping said scanning means at said selected terminal, and means for providing a signal indicating a condition of said selected terminal and for alternately providing a reference signal.

21. The apparatus according to claim 20 wherein said selecting means comprises a tolerance selection matrix having a hold position.

22. The apparatus according to claim 20 wherein said means for providing comprises a monitor jack and a monitor switch, said monitor switch controlling the reference signal and the condition indicating signal of said selected terminal applied to said monitor jack.

* * * * *

UNITED STATES PATENT AND TRADEMARK OFFICE
CERTIFICATE OF CORRECTION

PATENT NO. : 4,255,792
DATED : March 10, 1981
INVENTOR(S) : Pawan K. Das

It is certified that error appears in the above-identified patent and that said Letters Patent are hereby corrected as shown below:

Column 5, line 28, "$( - B)V_R$" should read --$(1 - B)V_R$--.

Column 5, line 61, "1A5" should read --A5--.

Column 9, line 22, "is activated" should read --is now activated--.

Column 9, line 50, "crds" should read --cards--.

Signed and Sealed this

Fourth Day of May 1982

[SEAL]

Attest:

Attesting Officer

GERALD J. MOSSINGHOFF
*Commissioner of Patents and Trademarks*